United States Patent
Nomoto et al.

(10) Patent No.: US 6,495,773 B1
(45) Date of Patent: Dec. 17, 2002

(54) WIRE BONDED DEVICE WITH BALL-SHAPED BONDS

(75) Inventors: Ryuji Nomoto, Kawasaki (JP); Kazuto Tsuji, Kawasaki (JP); Mitsutaka Sato, Kawasaki (JP); Junichi Kasai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/160,536

(22) Filed: Sep. 25, 1998

Related U.S. Application Data

(62) Division of application No. 08/628,936, filed on Apr. 8, 1996, now Pat. No. 5,842,628.

(30) Foreign Application Priority Data

Apr. 10, 1995 (JP) ............................................. 7-083726
Mar. 27, 1996 (JP) ............................................. 8-72309

(51) Int. Cl.[7] ................................................. H05K 1/16
(52) U.S. Cl. .................... 174/260; 361/776; 228/180.5; 257/780
(58) Field of Search ............................... 257/780, 781, 257/735, 673; 438/611, 613, 612, 617, 615; 228/180.21, 181.22, 180.5; 361/776; 174/250, 260

(56) References Cited

U.S. PATENT DOCUMENTS

| | | | |
|---|---|---|---|
| 4,142,288 A | 3/1979 | Flammer et al. ............... 29/628 |
| 4,732,313 A | 3/1988 | Kobayashi et al. .......... 228/179 |
| 4,875,618 A | 10/1989 | Hasegawa et al. ........... 228/179 |
| 5,151,559 A | * 9/1992 | Conru et al. ................ 174/52.4 |
| 5,295,619 A | 3/1994 | Takahashi et al. ........ 228/180.5 |
| 5,328,079 A | * 7/1994 | Mathew et al. ........... 228/180.5 |
| 5,431,329 A | 7/1995 | Hasegawa et al. ........ 228/180.5 |
| 5,476,211 A | 12/1995 | Khandros ................. 228/180.5 |
| 5,874,354 A | * 2/1999 | Heitzer et al. ............... 438/612 |
| 5,976,964 A | * 11/1999 | Ball ............................ 438/613 |
| 6,040,984 A | * 3/2000 | Hirakawa .................... 361/777 |

FOREIGN PATENT DOCUMENTS

| | | |
|---|---|---|
| JP | 60-245237 | 12/1985 |
| JP | 61-280626 | 12/1986 |
| JP | 2-94533 | 4/1990 |
| JP | 5-6893 | 1/1993 |
| JP | 6-140454 | 4/1994 |

* cited by examiner

Primary Examiner—Kamand Cuneo
(74) Attorney, Agent, or Firm—Armstrong, Westerman & Hattori, LLP

(57) ABSTRACT

A wire bonding method includes a first bonding process for forming a first ball-shaped part in a wire and bonding the first ball-shaped part to a first connected member; a ball-shaped part forming process for guiding the wire away from a position where the wire is bonded to an inner lead so as to form a predetermined loop, and a second bonding process for forming a second ball-shaped part in a predetermined position in the wire; and a second bonding process for bonding the second ball-shaped part to a semiconductor element pad that serves as a second connected member.

4 Claims, 24 Drawing Sheets

WIRE BONDED DEVICE WITH BALL-SHAPED BONDS

This application is a division of prior application Ser. No. 08/628,936 filed Apr. 8, 1996 now U.S. Pat. No. 5,842,628.

BACKGROUND OF THE INVENTION

1. Field of the Invention

The present invention relates to wire bonding methods, semiconductor devices, capillaries for wire bonding and methods of forming ball bumps, and, more particularly, to a wire bonding method, a semiconductor device, a capillary for wire bonding and a method of forming ball bumps which provide an efficient and reliable wire bonding.

Generally, semiconductor elements provided in a semiconductor device are electrically connected, using a wire, to a lead serving as an external connection terminal. Such a wire is disposed by a wire bonding unit to extend between a pad formed on a semiconductor element and an inner lead of the lead.

The number of wires disposed is equal to the number of pads formed on the semiconductor element. With increasingly higher degree of integration, an increasing number of pads are provided in semiconductor elements. As a result, the number of wires disposed between the pad and the inner lead becomes increasingly large.

Improvement in productivity and reduction of size are major requirements in manufacturing a semiconductor device. Reduction of time needed to wire-bond individual wires lends itself to improvement in productivity, while lowering of a loop height of wires lends itself to reduction of size.

2. Description of the Prior Art

FIGS. 1 and 2 show wires disposed according to the conventional wire bonding. FIGS. 3A–3C and FIGS. 4A–4C show a detailed wire bonding method.

FIG. 1 shows a wire 1 disposed using the most generally practiced wire bonding method. Referring to FIG. 1, the wire 1 is disposed between a pad 2a formed in a semiconductor element 2 and an inner lead 3a of a lead frame 3.

In order to dispose the wire 1 between the pad 2a and the inner lead 3a, the wire 1 is first bonded to the pad 2a (first bonding). In this case, the ball bonding as shown in FIGS. 3A–3C is employed in the first bonding.

As shown in FIGS. 3A–3C, a metal wire forming the wire 1 is led through a capillary 7 provided in a wire bonding unit. Referring to FIG. 3A, a ball-shaped part 4 is formed at the head of the wire 1 by spark discharge. Then, as shown in FIG. 3B, the ball-shaped part 4 is pressed against the pad 2a using the capillary 7 and bonded therewith using the ultrasonic welding process.

Then, the wire 1 which extends to the inner lead 3a is formed by a guiding process effected by guiding by drawing the capillary 7 in a direction indicated in FIG. 3C. The wire 1 is bonded to the inner lead 3a (second bonding). In this case, the stitch bonding process shown in FIGS. 4A–4C is employed in the second bonding.

Referring to FIG. 4A, the end of the capillary 7 is guided by drawing to a bonding position of the inner lead 3a. Subsequently, as shown in FIG. 4B, the end of the capillary 7 is pressed against the inner lead 3a so that the wire 1 is bonded to the inner lead 3a in the ultrasonic welding process. The portion of the wire 1 which is pressed by the capillary 7 is deformed as a result of the capillary 7 being pressed against the inner lead 3a.

Thereafter, the capillary is guided upward. While the capillary is guided upward, a clamper 8 provided in the wire bonding unit holds the wire 1 fixed. Therefore, the wire 1 is cut at the portion thereof that is deformed and has lost the mechanical strength.

As has been described, according to the most generally practiced conventional wire bonding method, the wire 1 is provided between the pad 2a of the semiconductor element 2 and the inner lead 3a of the lead frame 3 as shown in FIG. 1 through the first bonding that uses the ball bonding process and the second bonding that uses the stitch bonding process (hereinafter, such a method of providing the wire 1 is referred to as forward bonding).

A description will now be given, with reference to FIGS. 5A–6B, of the characteristic of the ball bonding process and the stitch bonding process.

FIG. 5A is a perspective view showing how the wire 1 is bonded to the pad 2a using the ball bonding process, and FIG. 5B is a top view of the bonded area. As has been described already, the ball bonding process is performed such that the ball-shaped part 4 is formed in the wire 1 using spark discharge and then bonded to the pad 2a. As a result of such a process, the bonded area at the bottom of the ball-shaped part 4 has a circular shape in a top view and resides within the pad 2a.

FIG. 6A is a perspective view showing how the wire 1 is bonded to the inner lead 3a using the stitch bonding process, and FIG. 6B is a top view of the bonded area. As shown in the figures, since the wire 1 is pressed by the capillary 7 according to the stitch bonding, the wire 1 is flattened into a bonded portion 9 having a relatively wide area. For comparison, FIGS. 6A and 6B include broken lines indicating the pad 2a. Characteristically, the stitch bonding process requires a wider bonding area as compared to the ball bonding process.

In the forward bonding described above, the wire 1 is guided upward after being bonded to the pad 2a and then bonded to the inner lead 3a. Hence, the height of the loop formed by the wire 1 is relatively high with respect to the upper major surface of the semiconductor element 2.

In the construction shown in FIG. 1, the wire 1 is higher in level than the upper major surface of the semiconductor element 2 by a height H. Accordingly, the forward bonding has a problem in that it is difficult to make the semiconductor device thin.

FIG. 2 shows a wire 5 provided according to a bonding method proposed to eliminate the problem resulting from the forward bonding. In FIG. 2, those components that are the same as the components of FIG. 1 are designated by the same reference numerals.

As shown in FIG. 2, the wire 5 is provided such that the ball-shaped part 4 is formed at the end of the wire 5 jutting out of a capillary using spark discharge. The ball-shaped part 4 is then pressed against the inner lead 3a of the lead frame 3 so as to be welded thereon according to the ball bonding process.

The capillary is then guided upward to a level slightly higher than the upper major surface of the semiconductor element 2 and then guided horizontally so that the wire 5 is guided to a position above the pad 2a. The capillary is then pressed against the pad 2a so that the wire 5 is bonded to the pad 2a using the stitch bonding process. More specifically, a ball bump 6 formed of a gold or the like is provided in advance on the pad 2a, and the wire 5 is bonded to the ball bump 6.

It will be noted that the bonding order of the bonding method shown in FIG. 2 is different from that of the bonding method shown in FIG. 1 in that wire is bonded to the inner lead 3a in the first bonding and then bonded to the pad 2a (more specifically, to the ball bump 6 on the pad 2a) in the second bonding. The method for providing the wire 5 will be referred to as a backward bonding.

According to the backward bonding, wire 5 is first bonded to the inner lead 3a which is lower in level than the upper major surface of the semiconductor element 2. The wire 5 is then guided upward to reach the same height as the upper major surface of the semiconductor element 2. Thereafter, the capillary is guided horizontally so that the wire 5 can be bonded to the pad 2a (more specifically, the ball bump 6).

As shown in FIG. 2, the wire 5 provided between the pad 2a and the inner lead 3a is bent to form an approximately right angle (an inverted L shape) so that the loop formed by the wire 5 is lower than that of the construction shown in FIG. 1. Accordingly, it is possible to make the semiconductor device thin.

While the backward bonding described above ensures that the semiconductor device produced has a relatively small height because the loop-formed by the wire 5 is relatively low, it has a problem in that the ball bump 6 must be formed on the pad 2a using a gold or the like.

The ball bump 6 serves as a buffer for preventing the pressure of the capillary from being exerted on the semiconductor element 2 directly when the wire 5 is bonded to the pad 2a using the stitch bonding process. The ball bump 6 also has a function of improving the resistance of the wire bonding.

If the wire 5 is directly bonded to the pad 2a using the stitch bonding process without using the ball bump 6, the semiconductor element 2 may be damaged due to the pressure exerted by the capillary. Insufficient bonding of the wire 5 to the pad 2a may cause the wire 5 to be removed from the pad 2a. For this reason, it is necessary to provide the ball bump 6 on the pad 2a in the conventional backward bonding.

The conventional backward bonding has a problem in that a process of providing the ball bump 6 is needed in addition to the process of providing the wire 5, adding to the number of processes in the wire bonding, and in that the efficiency in producing the semiconductor device is unsatisfactory.

The ball bonding process employed in forming the ball bump 6 is such that a gold ball is formed at the end of a gold wire and then bonded to the pad 2a, after which the gold wire is cut. In this process of forming the gold ball, a pressure is exerted on the semiconductor element 2.

As has been described, the bonding of the wire 5 to the ball bump 6 involves a pressure exerted on the semiconductor element 2. Therefore, the semiconductor element 2 undergoes the pressure on two occasions during the wire bonding process, that is, when the ball bump 6 is formed and when the wire 5 is bonded. Thus, even if the ball bump 6 is provided, a possibility remains that the semiconductor element 2 is damaged during the whole wire bonding process.

As has been described with reference to FIGS. 5A–6B, the stitch bonding process requires a wider bonding area as compared to the ball bonding process. Therefore, it is impossible to bond the wire 5 on the upper major surface of the semiconductor element 2 with a high density in the backward bonding. The stitch bonding process is not opted for if the semiconductor element 2 has pads 2a disposed thereon with a high density.

For this reason, only the forward bonding shown in FIG. 1 can be applied to the high-density semiconductor element 2. Accordingly, the semiconductor element 2 has a relatively large size for the aforementioned reason.

As has been described, the backward bonding is useful for the semiconductor element 2 that does not have pads 2a disposed thereon with a high density. However, an upper surface 6a (the surface to which the wire 5 is bonded) of the ball bump 6 is rugged because it is the cut surface of the gold wire. Therefore, the bonding strength that exists between the wire 5 and the ball bump 6 is not satisfactory so that the reliability of the wire bonding is not satisfactory.

Further, as shown in FIG. 8, if an especially large bump 6b is produced on an upper surface of the ball bump 6, the wire 5 is bonded at a position displaced from the center of the ball bump 6. An edge part 5a characterized by a low bonding strength and produced as a result of the wire 5 deformed flat by the capillary 7 resides on the end of the upper major surface of the ball bump 6. The wire 5 may be cut at a portion adjacent to the edge of the upper major surface of the ball bump 6.

It is thus an object of the present invention to provide a semiconductor device having a wire loop with an L shape or curved shape. In this present invention, the semiconductor device includes a semiconductor element; a lead; a wire connecting the semiconductor element and the lead, wherein the lead is directly bonded to the wire using a first ball-shaped part formed in the wire. An electrode formed in the semiconductor element is directly bonded to the wire using a second ball-shaped part formed in the wire. The wire forms a loop having a curved shape and including a vertical portion that extends vertically from a position where the wire is bonded to the lead, and a horizontal portion that extends horizontally from a position where the semiconductor element is bonded to the wire.

SUMMARY OF THE INVENTION

Accordingly, it is an object of the present invention to provide a wire bonding method, a semiconductor device, a capillary for wire bonding and a method of forming ball bumps in which the aforementioned problems are eliminated.

Another and more specific object of the present invention is to provide a wire bonding method, a semiconductor device, a capillary for wire bonding and a method of forming ball bumps which provide an efficient bonding process, reduction in damage to connected bodies, and reduction in the height of semiconductor elements.

In order to achieve the aforementioned objects, the present invention provides a wire bonding method comprising:

a first bonding process for forming a first ball-shaped part in a wire and bonding the first ball-shaped part to a first connected member;

a ball-shaped part forming process for guiding the wire away from the first connected member so as to form a predetermined loop and forming a second ball-shaped part in a predetermined position in the wire; and a second bonding process for bonding the second ball-shaped part to a second connected member.

According to the wire bonding method of the present invention, a damage is prevented from occurring in a semiconductor element when the wire is bonded to the second connected member because the second ball-shaped part functions in the same manner as a ball bump of the backward bonding process. Since the second ball-shaped part is formed in the wire, no additional process separate from the sequence of the wire bonding process is necessary in order to form the ball bump. Accordingly, the wire bonding process can be carried out efficiently. The process for bonding the second ball-shaped part to said second connected member is a so-called ball bonding process and requires a relatively small area. Hence, a wire bonding process can be securely carried out in a semiconductor element characterized by a high density with which electrodes are provided.

Preferably, in the ball-shaped part forming process, the second ball-shaped part is formed while the wire remains uncut. According to this aspect of the present invention, it is possible to position the second ball-shaped part on the pad in a reliable manner. Accordingly, the second ball-shaped part can be properly bonded to the pad.

Preferably, at least the second ball-shaped part is formed by spark discharge. According to this aspect of the present invention, no modification to the existing wire bonding unit is necessary because the spark discharge process is normally practiced to form the first ball-shaped part.

In another preferred embodiment, the wire is guided vertically upward after the first ball-shaped part is bonded to the first connected member; and the wire is then guided horizontally, forming a right angle, whereupon the second ball-shaped part is formed and bonded to the second connected member. According to this aspect of the present invention, the wire provided between the first connected member and the second connected member is low. Therefore, the height of the semiconductor device produced can be kept low.

In order to attain the aforementioned objects, the present invention provides a wire bonding method comprising the steps of:

providing a first wire according to the wire bonding method as claimed in claim 1;

forming a third ball-shaped part in a second wire and bonding the third ball-shaped part to the second connected member; and guiding the second wire away from the second connected member so as to form a loop above the first wire, and stitch-bonding the second wire to the first connected member.

According to this wire bonding method, the second wire can be easily provided above the first wire because the loop formed,by the first wire is low. Accordingly, it is possible to provide wires with a high density and to prevent the first and second wires from interfering each other.

In another preferred embodiment, the first connected member is embodied by a lead frame, and the second connected member is embodied by a semiconductor element. Accordingly, the semiconductor device can be thin and the production efficiency thereof is improved as compared to the conventional method.

In still another preferred embodiment, the first connected member and the second connected member are embodied by a semiconductor. Therefore, the multi-chip module produced according to the present invention can be thin and the production efficiency thereof is improved as compared to the conventional method.

In yet another preferred embodiment, the wire is embodied by a thin gold wire, and a ball bonding process is employed to bond at least the second ball-shaped part to the second connected member. According to this aspect of the present invention, a damage is prevented from being exerted on the second connected member.

In order to attain the aforementioned objects, the present invention also provides a semiconductor device comprising:

a semiconductor element;

a lead; and a wire connecting the semiconductor element and the lead;

wherein the lead is directly bonded to the wire using a first ball-shaped part formed in the wire, an electrode formed in the semiconductor element is directly bonded to the wire using a second ball-shaped part formed in the wire, and the wire forms a loop having an L shape and including a vertical portion that extends vertically from a position where the wire is bonded to the lead, and a horizontal portion that extends horizontally from a position where the semiconductor element is bonded to the wire.

According to the semiconductor device of the present invention, a damage exerted on the semiconductor element is reduced because the electrode formed on the semiconductor element is directly bonded to the wire using the second ball-shaped part formed in the wire. By providing the wire so as to form a L-shaped loop, it is possible to reduce the height of the semiconductor device.

In order to attain the aforementioned objects, the present invention also provides a wire bonding capillary for use in a bonding process for bonding a wire to a connected member, wherein an end of a main body of the capillary includes a projection. According to the wire bonding capillary of the present invention, the end portion projecting from the main body of the capillary acts to bond the wire to the ball bump and the portion surrounding the projecting end portion acts to press the ball bump.

Preferably, a bonding part for bonding the wire to the connected member is formed at the end of the main body of the capillary, and a pressurizing part for pressing a ball-shaped part formed by the bonding part in the connected member is formed adjacent to the bonding part. Accordingly, the process for bonding the wire to the connected member and the process for welding the ball-shaped part formed in the connected member can be carried out using the same capillary. Hence, the forming of the ball bump can be carried out efficiently.

In order to attain the aforementioned objects, the present invention also provides a ball bump forming method using the wire bonding capillary as claimed in claim 10, the ball bump forming method comprising:

a bonding process for forming the ball-shaped part in the wire and bonding the ball-shaped part to the connected member using an end portion of the wire bonding capillary;

a ball bump forming process for forming a ball bump on the connected member by cutting the wire by drawing the wire bonding capillary away from a position where the wire is bonded to the connected member; and a shaping process for turning an upper major surface of the ball bump flat by causing a portion of the wire bonding capillary which portion surrounds the end portion to press the ball bump.

Further, the present invention provides a ball bump forming method using the wire bonding capillary as claimed in claim 11, the ball bump forming method comprising:

a bonding process for forming the ball-shaped part in the wire and bonding the ball-shaped part to the connected member using the bonding part provided in the wire bonding capillary;

a ball bump forming process for forming a ball bump on the connected member by cutting the wire by drawing the wire bonding capillary away from a position where the wire is bonded to the connected member; and a shaping process for turning an upper major surface of the ball bump flat by causing the pressurizing part provided in the wire bonding capillary to press the ball bump.

According to the ball bump forming method of the present invention, the upper major surface of the ball bump formed in the connected member can be turned flat. Thus, the quality of bonding that exists between the ball bump and the wire can be improved, resulting in a highly resistant bonding. The bonding process, the ball bump forming process and the shaping process can be effected in a successive manner using the same capillary. Hence, the ball bump forming process according to the present invention is highly efficient.

BRIEF DESCRIPTION OF THE DRAWINGS

Other objects and further features of the present invention will be apparent from the following detailed description when read in conjunction with t accompanying drawings, in which.

DESCRIPTION OF THE PREFERRED EMBODIMENTS

A description will now be given, with reference to FIGS. 9–29, of the embodiments of the present invention.

FIGS. 9–14 are diagrams which explain the wire bonding method according to a first embodiment of the present invention. The description given below of the first embodiment assumes that the wire bonding method is applied to the semiconductor production process. However, the application of the first embodiment is not limited to the semiconductor production process.

Figure 9:
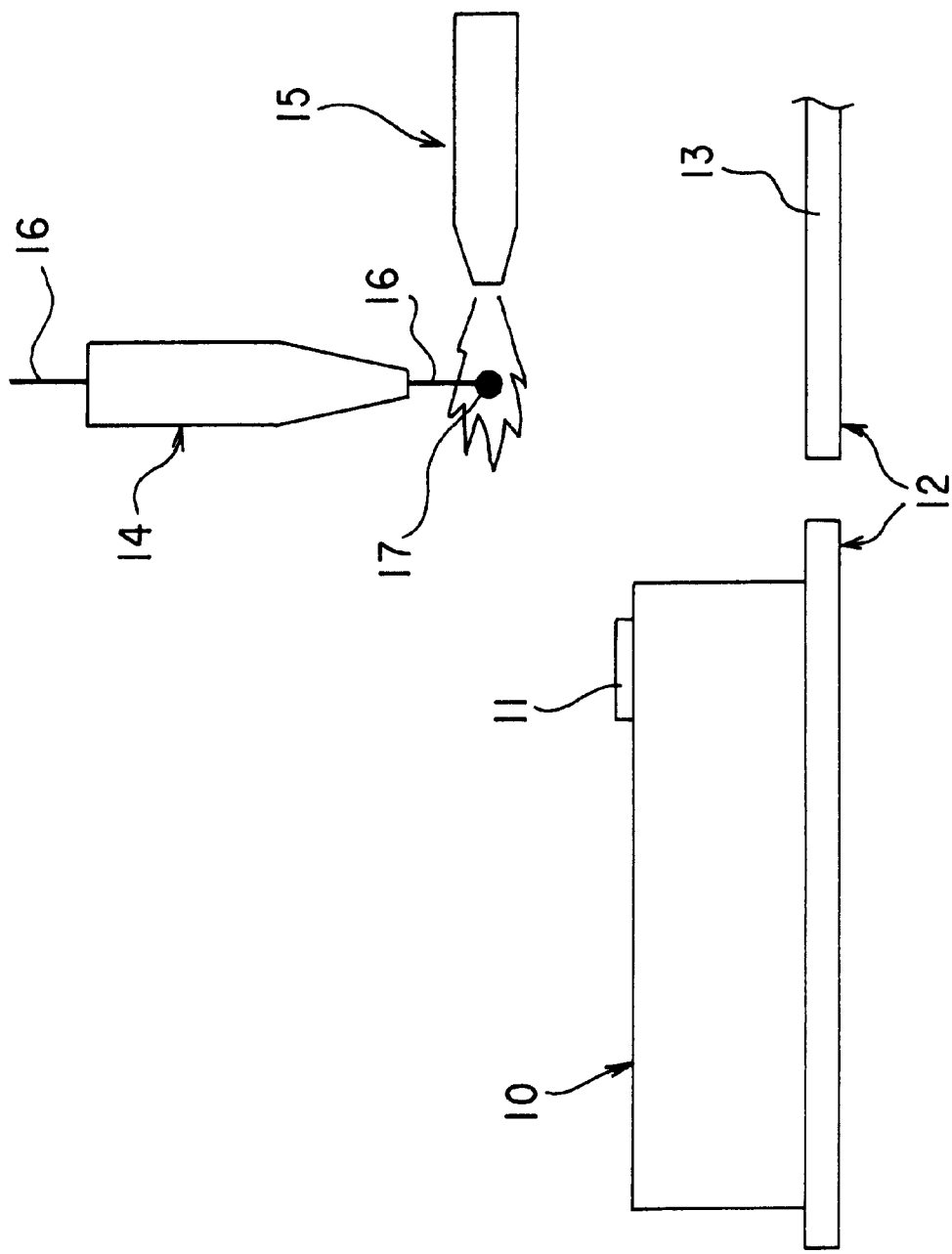
FIG. 9 shows how a first ball-shaped part is formed.

A description will be given, with reference to FIG. 9, of constituting elements used in the wire bonding. Referring to FIG. 9, a pad 11 is provided on a semiconductor element 10. The semiconductor element 10 is mounted on a lead frame 12. An inner lead 13 of a lead 22 (see FIG. 16) that constitute the lead frame 12 lies in the neighborhood of the semiconductor element 10.

A capillary 14 and a spark electrode 15 constitute a wire bonding unit. The capillary 14 and the spark electrode 15 are provided in the conventional wire bonding unit and are not new features added to the construction of the wire bonding method according to the first embodiment.

A thin gold wire that embodies a wire 16 is inserted through the capillary 14. The capillary 14 is translatable by a translation unit (not shown). An ultrasonic oscillation is connected to the capillary 14 so that the wire 16 and a connected member (the pad 11 and the inner lead 13, in the case of the first embodiment) are welded together by ultrasonic welding owing to ultrasonic oscillation generated by the ultrasonic oscillator.

The spark electrode 15 is also translatable by a translation unit (not shown).

A description will now be given of the wire bonding method according to the first embodiment. As shown in FIG. 9, a first ball-shaped part 17 is formed at the end of the wire 16 inserted through the capillary 14 and projecting downward from the end of the capillary 14. The first ball-shaped part 17 is formed as a result of spark discharge induced by the spark electrode 15.

Figure 10:
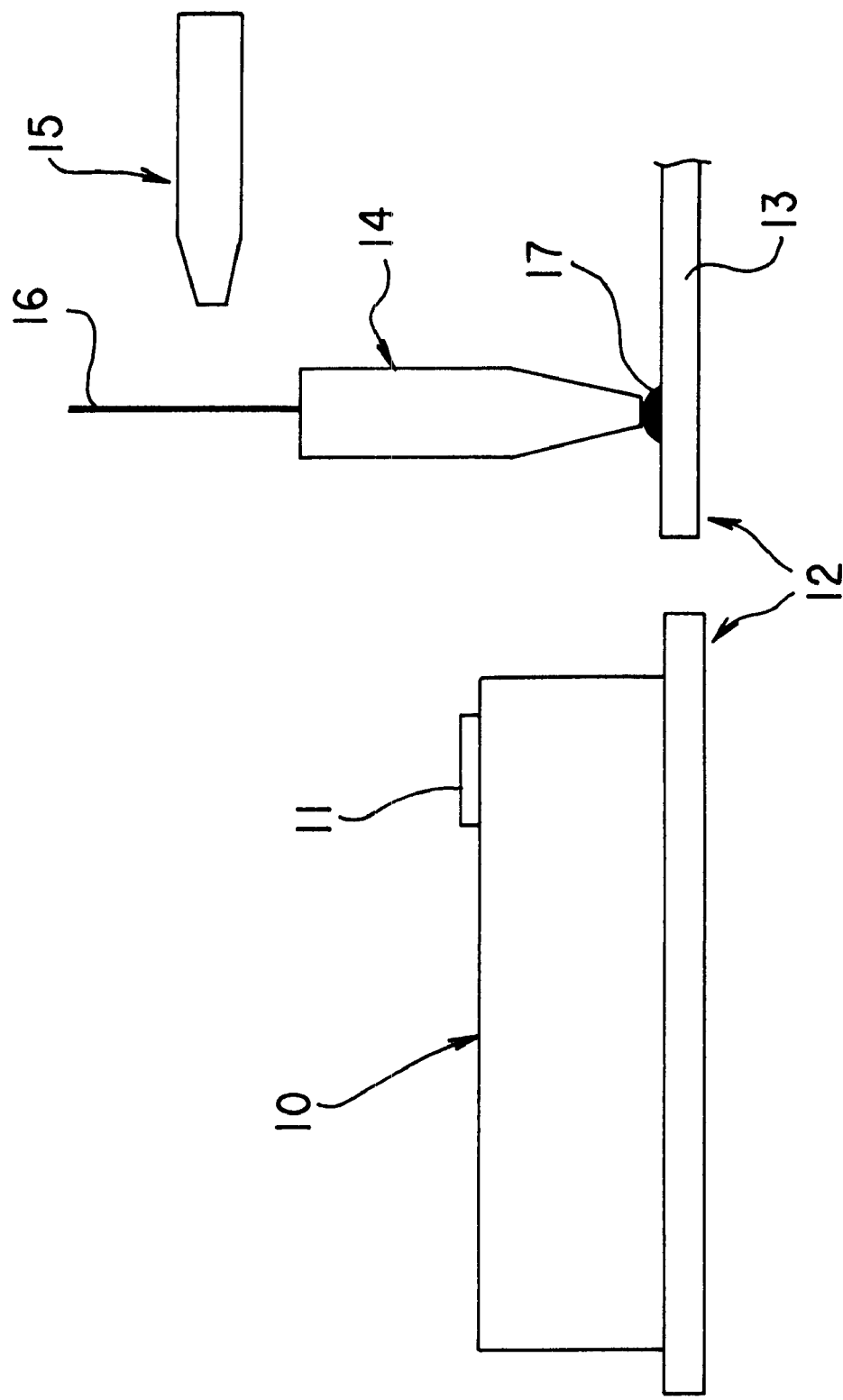
FIG. 10 shows how the first ball-shaped part is bonded to a lead frame.
Figure 11:
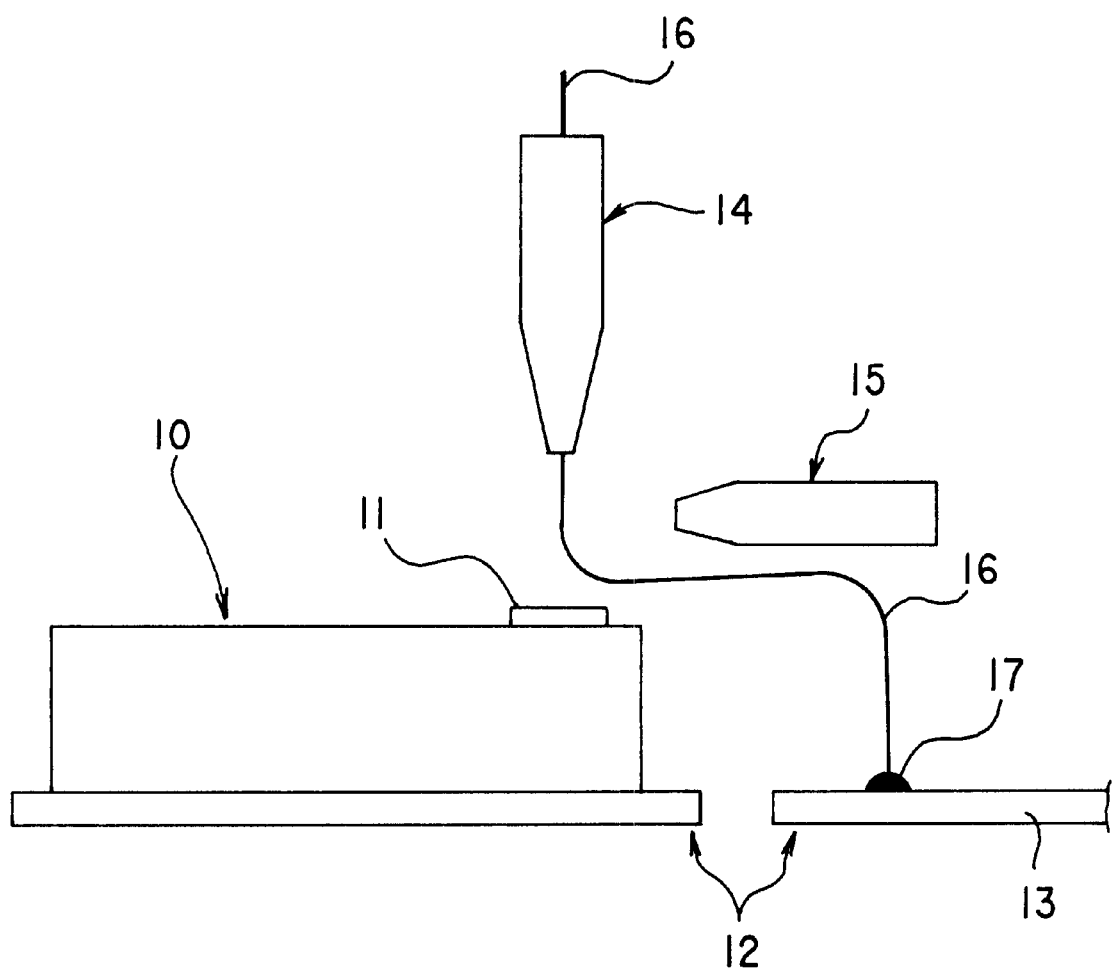
FIG. 11 shows how the wire is guided to a pad.

When the first ball-shaped part 17 has been formed at the end of the wire 16 projecting from the end of the capillary 14, the capillary 14 is translated toward the inner lead 13 by the translation unit so that the first ball-shaped part 17 is pressed against the inner lead 13, as shown in FIG. 10. The ultrasonic oscillator is then driven to generate ultrasonic oscillation so that the capillary 14 acts to weld the first ball-shaped part 17 to the inner lead 13 according to the ultrasonic welding process (first connected member as described in the claims). As a result, the wire 16 is ball-bonded to the inner lead 13. The above-described part of the wire bonding will be referred to as a first bonding process.

When the wire 16 (the first ball-shaped part 17) has been bonded to the inner lead 13, the capillary 14 is translated vertically upward to a level slightly higher than the upper major surface of the semiconductor element 10, and then translated horizontally so that the capillary 14 is located above the pad 11 formed on the upper major surface of the semiconductor element 10. While the capillary 17 is being translated, the wire 16 continues to be fed to the capillary 14.

By translating the capillary 14 as described above, the wire 16 forms a loop having a inverted L shaped such that the loop includes a vertically extending part which projects vertically upward from the inner lead 13 and a horizontally extending part which extends horizontally.

Figure 12:
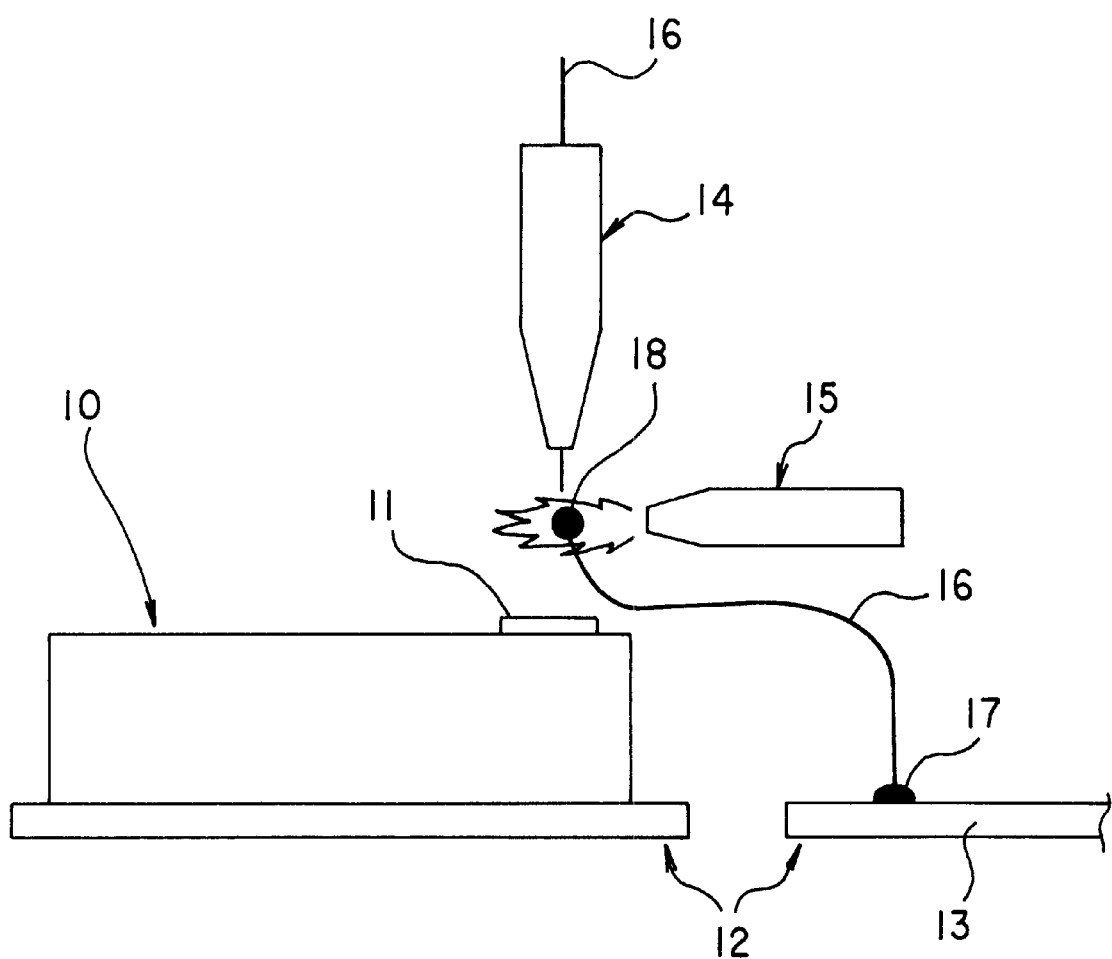
FIG. 12 shows how a second ball-shaped part is formed.

When the wire 16 is guided by drawing to a position above the pad 11, the spark electrode 15 is translated below the capillary 14. As shown in FIG. 12, a second ball-shaped part 18 is formed by spark discharge in the wire 16 that is fed outside the capillary 14, in a process that will be referred to as a ball-forming process. The second ball-shaped part 18 is formed by spark discharge at an intermediate position in the wire 16 that is guided away from the first ball-shaped part 17.

Figure 13:
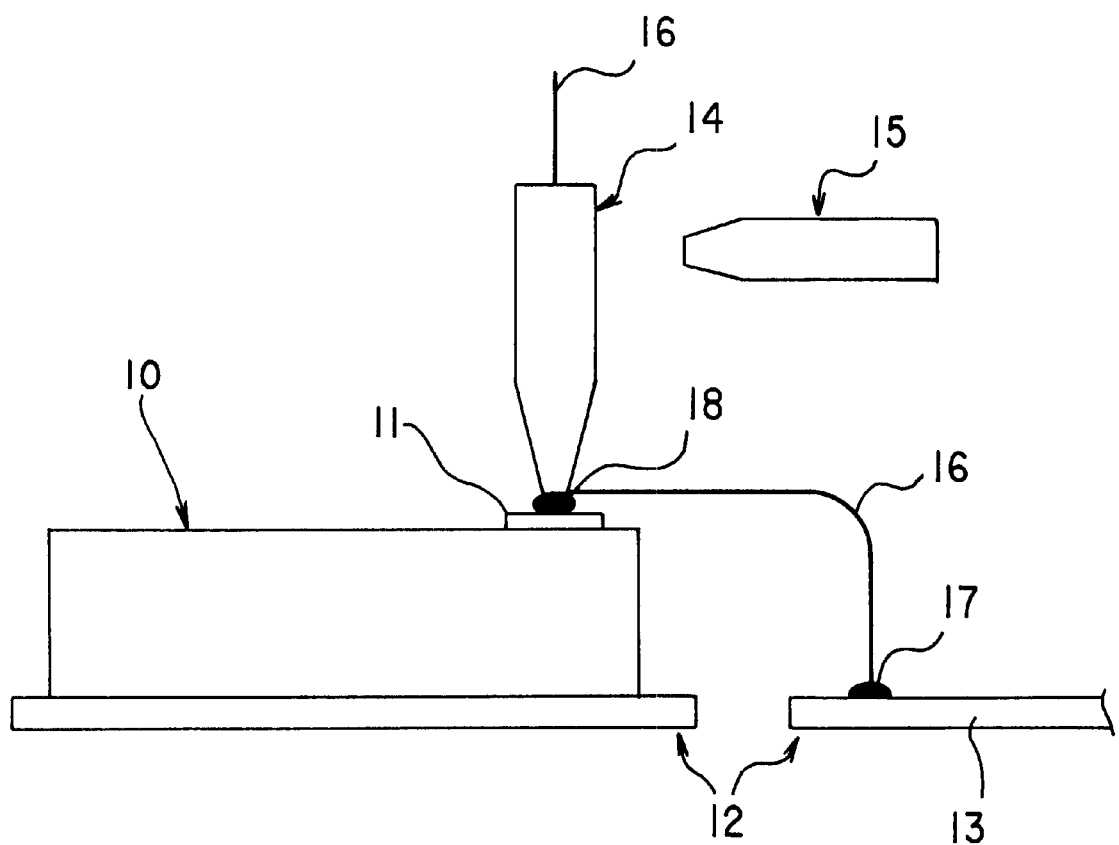
FIG. 13 shows how the second ball-shaped part is bonded to the pad.

Subsequently, the capillary 14 is translated downward so as to press the second ball-shaped part 18 against the pad 11. At the same time, the ultrasonic oscillator is driven to generate ultrasonic oscillation. Therefore, as shown in FIG. 13, the second ball-shaped part 18 is bonded to the pad 11 (second connected member as described in the claims) using the capillary 14. This part of the wire bonding will be referred to as a second bonding process.

Figure 14:
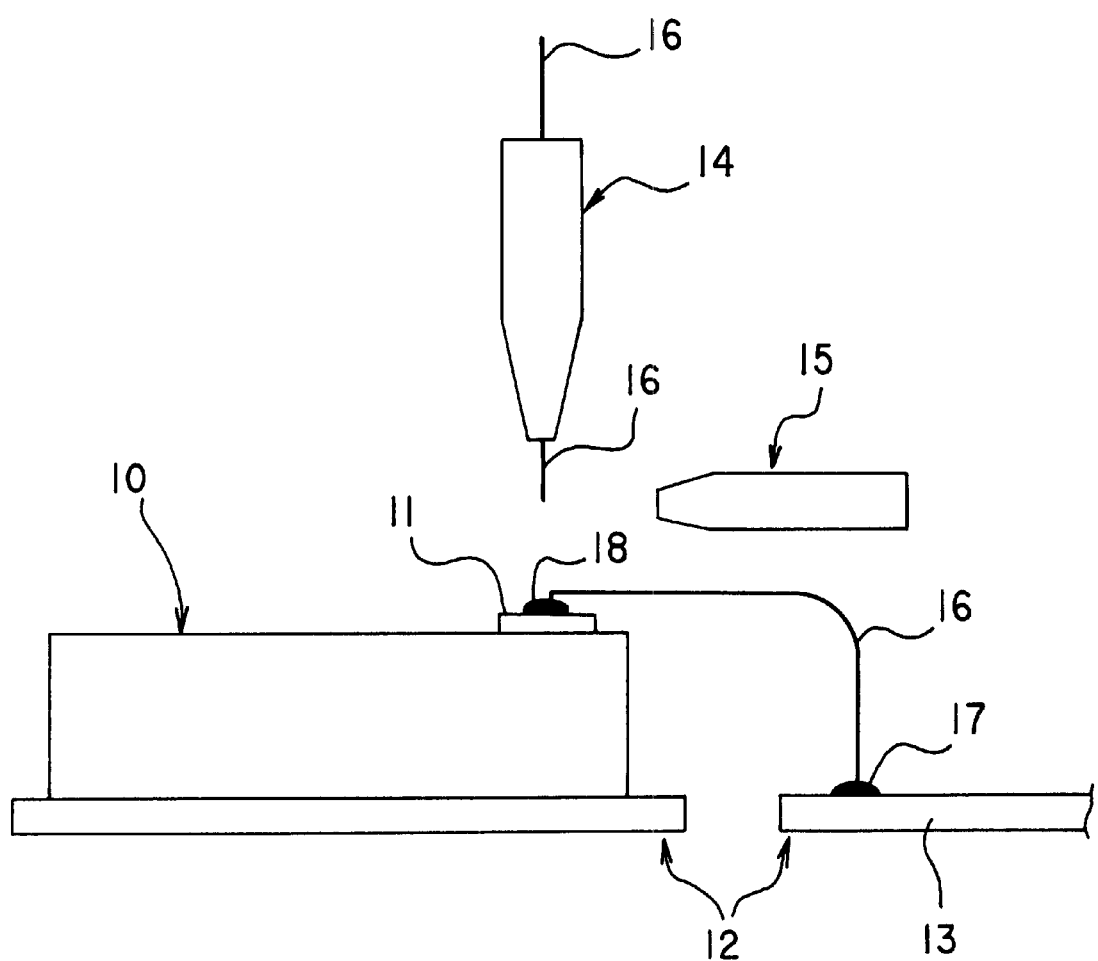
FIG. 14 shows a state in which the second ball-shaped part is bonded to the pad.

When the second ball-shaped part 18 has been bonded to the pad 11, the capillary 14 is translated upward to a position shown in FIG. 14. While the capillary 14 is translated being upward, the wire 16 is prevented from being fed through the lower end of the capillary 14, using a clamper (not shown), so that the wire 16 is cut at the bonding position as the capillary 14 is translated upward. This completes one sequence of the bonding process for the wire 16.

The first ball-shaped part 17 is then formed again, after which the processes shown in FIGS. 9–13 are repeated. In this way, bonding of the wire 16 to the pad 11 and the inner lead 13 is carried out on a continuous basis.

According to the wire bonding method described above, when the wire 16 is bonded to the pad 11, the second ball-shaped part 18 formed in the wire 16 has the same function as the ball bump 6 (see FIG. 2) in the backward bonding. The second ball-shaped part 18 functions as a shock absorber for preventing the semiconductor element 10 from being damaged when the wire 16 is bonded to the pad 11.

Since the second ball-shaped part 18 is formed in the wire 16, no additional process for forming the ball bump 6 is necessary aside from the main wire bonding process. Thus, it is possible to carry out wire bonding process in a simple and efficient manner.

Figure 5A:
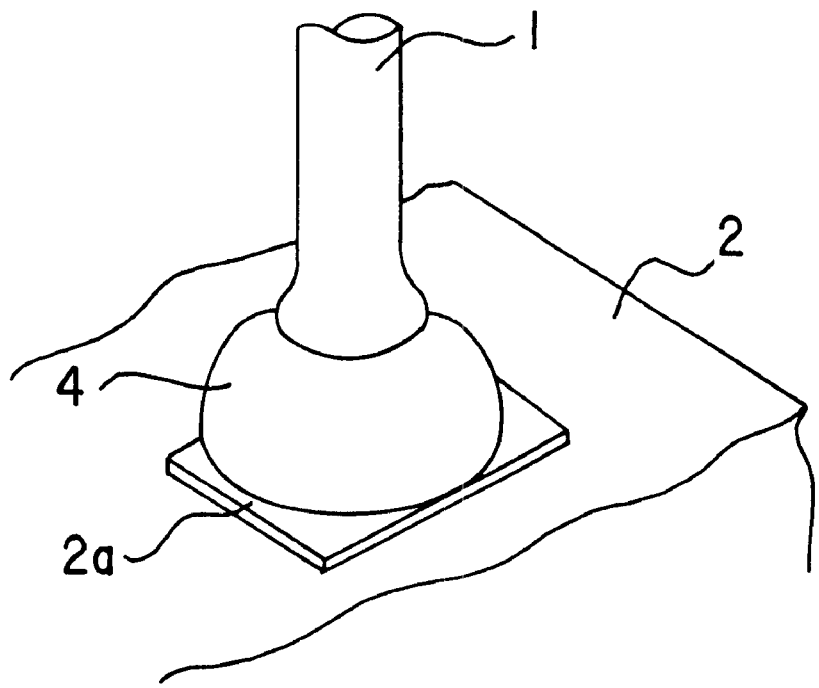
FIG. 5A is a perspective view showing how a wire is bonded to a pad using a ball bonding process.
Figure 5B:
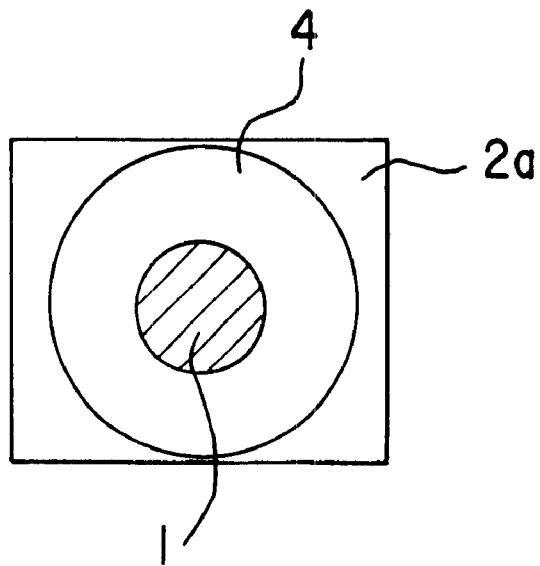
FIG. 5B is a top view showing a bonding position.
Figure 6A:
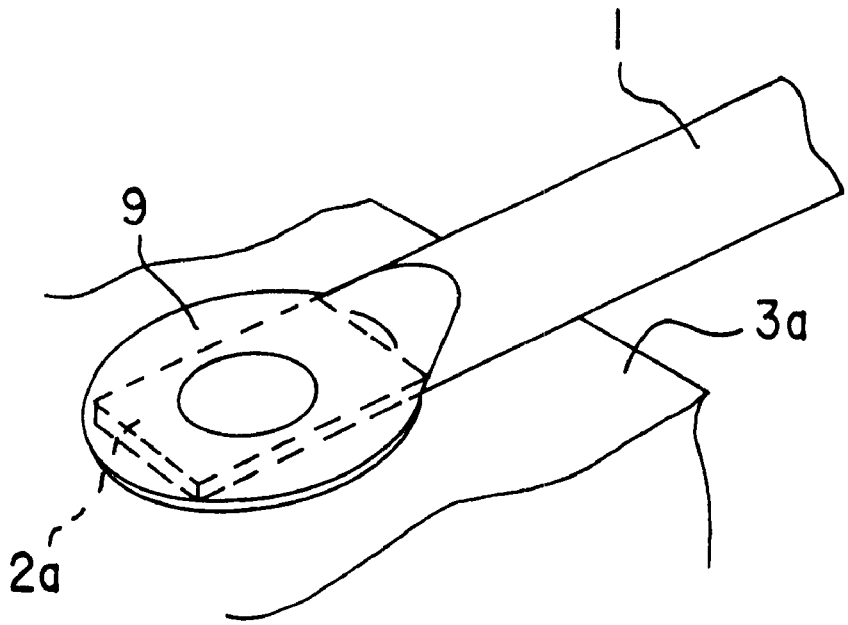
FIG. 6A is a perspective view showing how a wire is bonded to an inner lead using a stitch bonding process.
Figure 6B:
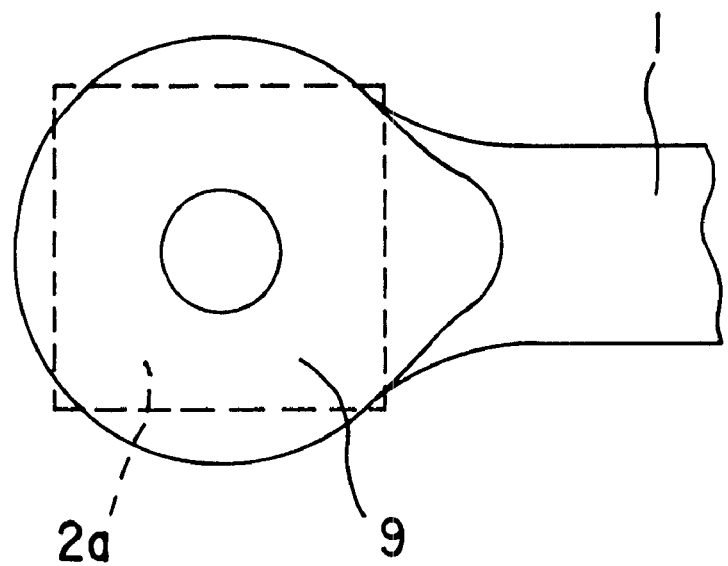
FIG. 6B is a top view showing a bonding position.

The second ball-shaped part 18 is bonded to the pad 11 in the ball bonding process. As shown in FIG. 5B, the bonded area is circular in shape in a top view and relatively small size. Because the ball bonding requires a relatively small area, the wire bonding process with respect to the semiconductor element 10 having a large number of pads 11 disposed with a high density is possible.

In the process shown in FIG. 12 for forming the second ball-shaped part 18, the wire 16 remains connected to the capillary 14. For this reason, in the second bonding process shown in FIG. 13, it is possible to position the second ball-shaped part 18 on the pad 11 in an accurate manner. Therefore, it is ensured second ball-shaped part 18 is reliably bonded to the pad 11.

Figure 15:
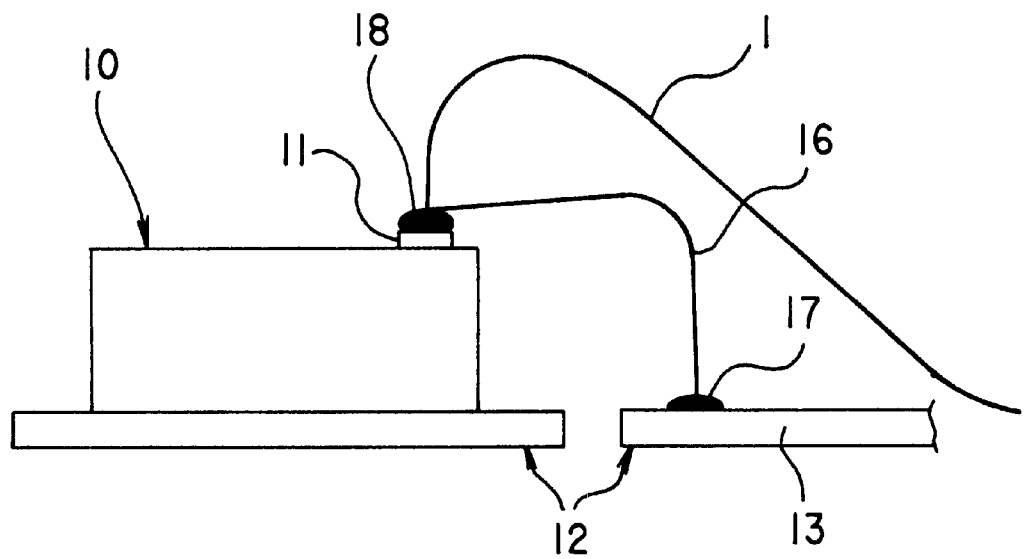
FIG. 15 gives a comparison between a loop formed by a wire provided according to a wire bonding method of the present invention and a loop formed by a wire provided according to a conventional wire bonding method.

Further, by using the wire bonding method according to the first embodiment, it is possible to maintain the loop formed by the wire 16 relatively low. FIG. 15 shows, for comparison, both the wire 16 provided by using the wire bonding method according to the embodiment described above and the wire 1 provided by using the conventional wire bonding method (forward bonding).

The wire 1 provided according to the conventional forward bonding forms a loop extending to the level higher than the upper major surface of the semiconductor element 10, as shown in FIG. 15. In contrast, the wire bonding according to the first embodiment employs the backward bonding in that the wire 16 is first connected to the inner lead 13 and then the wire 16 is guided by drawing to form a loop having an inverted L shape so as to be connected to the pad 11. Hence, the loop of the wire 16 is relatively low.

While the wire bonding according to the first embodiment is configured such that the wire 16 is provided in a process similar to that of the conventional backward bonding, an advantage of the wire bonding according to the first embodiment is that fewer processes are required in order to form the wire 16 having a loop as low as the loop formed by the conventional backward bonding process, because the second ball-shaped part 18 is formed directly in the wire 16 in a spark discharge process that uses the spark electrode 15.

Figure 16:
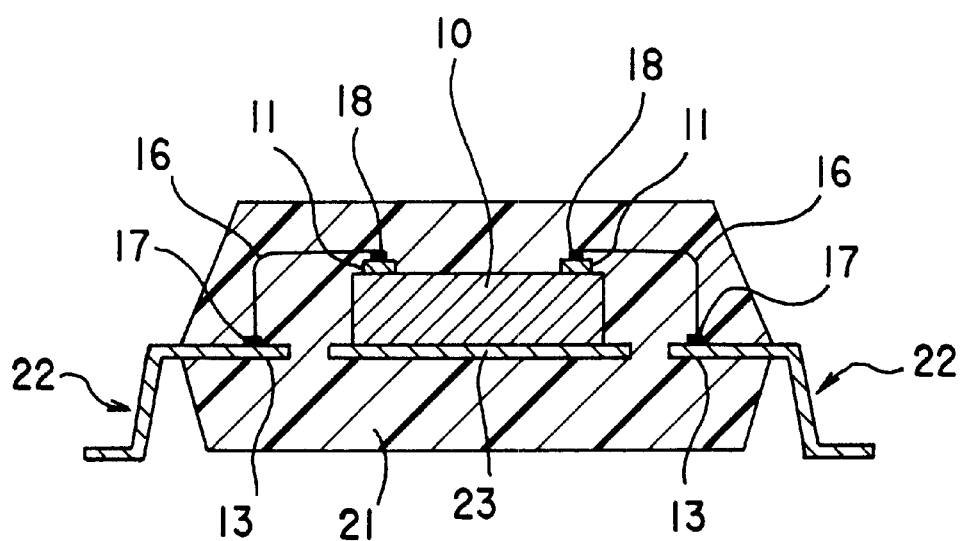
FIG. 16 is a lateral sectional view of a semiconductor device according to the present invention.

FIG. 16 shows a semiconductor device 20 according to a second embodiment of the present invention. In the semiconductor device 20, the wire 16 is provided according to the wire bonding method described above. FIG. 16 shows an example in which the wire bonding method described above is applied to a semiconductor device having a plastic package.

The semiconductor device 20 generally comprises the semiconductor element 10, the wire 16, the lead 22, a sealing resin 21 and the like. The semiconductor element 10 is mounted on a stage 23 that forms a part of a lead frame. The wire 16 is disposed between the pad 11 formed on the upper major surface of the semiconductor element 10 and the inner lead 13 of the lead 22, using the wire bonding method described above.

The sealing resin 21 is constructed to seal therein the semiconductor element 10 and the wire 16 so as to protect the semiconductor element 10 and the wire 16. Since it is necessary to provide the sealing resin 21 so as to cover at least the wire 16, the sealing resin 21 becomes thick if the loop formed by the wire 16 is high, resulting in a relatively large size of the semiconductor device.

However, the loop formed by the wire 16 produced according to the wire bonding method of the first embodiment is low so that the thickness of the resin package formed of the sealing resin 21 is small. Accordingly, the semiconductor device 20 is satisfactorily small in height.

Figure 17:
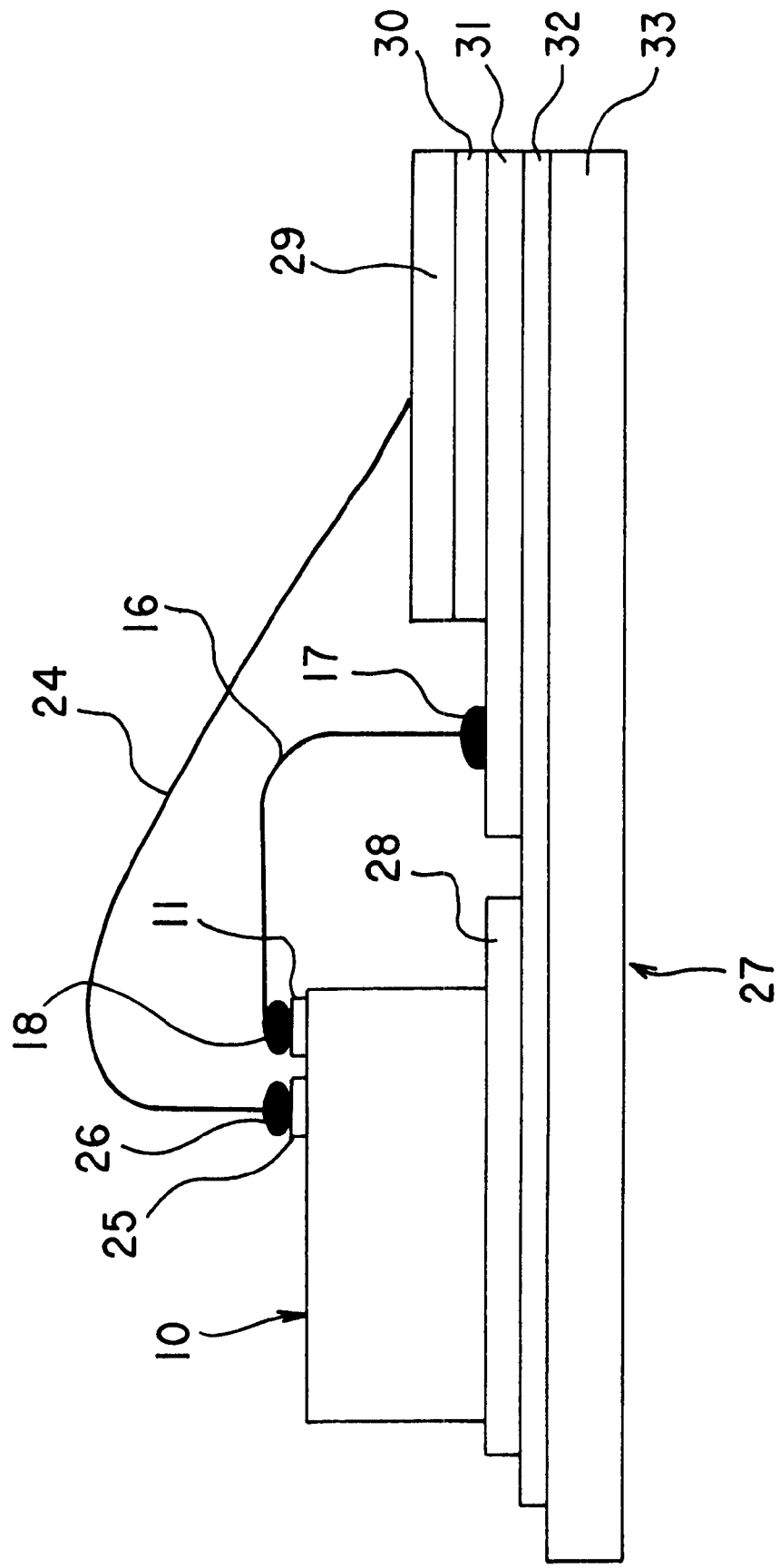
FIG. 17 illustrates a variation of the wire bonding method of the present invention.

FIG. 17 shows a variation of the wire bonding method of the present invention. FIG. 17 shows an example in which the wire bonding method of the present invention is applied to a wire connection structure in which the first wire 16 is provided above a second wire 24.

Recently, as semiconductor elements come to have increasingly higher density, the number of pads provided on the semiconductor elements becomes large. For example, the construction as shown in FIG. 17, in which two rows of pads 11 and 25 are provided on the semiconductor element 10, are available (in a top view, the pads 11 and 25 are usually provided in two straight lines or arrayed in a zig zag manner).

In such a construction, it is necessary to have the wire 16 extending from the pad 11 on the semiconductor element 10 and the wire 24 extending from the pad 25 on the semiconductor element 10. Hence, the wire connection structure in which the first wire 16 and the second wire 24 are provided with a vertical separation is required.

In the example shown in FIG. 17, the semiconductor element 10 is mounted on a die bonding layer 28 provided in a substrate 27. The substrate 27 is a stacked substrate comprising a first wiring layer 29, a first insulating layer 30, a second wiring layer 31 and a second insulating layer 32 are built, in the stated order from the top, on a base member 33. The pad 11 is electrically connected to the second wiring layer 30 by the first wire 16. The pad 25 is electrically connected to the first wiring layer 29 by the second wire 24.

In the above-described construction, the first wire 16 is provided using the wire bonding method of the present invention, and the second wire 24 is provided using the conventional forward bonding process. As has been described, the loop formed by the wire 16 provided using the wire bonding method of the present invention is lower than the loop formed by the wire 24 provided using the forward bonding process. For this reason, it is ensured that, even if the wire 24 is provided above the wire 16, the wires 16 and 24 are prevented from interfering with each other and causing a short circuit.

In a similar conventional construction, the overall height of the loops formed by the wires is significantly high because a second wire must be provided at a certain distance above a first wire provided in the forward bonding process and already forming a relatively high loop. By employing the wire bonding method according to the present invention to provide the first wire 16, the overall height of the loops formed by the wires 16 and 24 can be limited.

Figure 18:
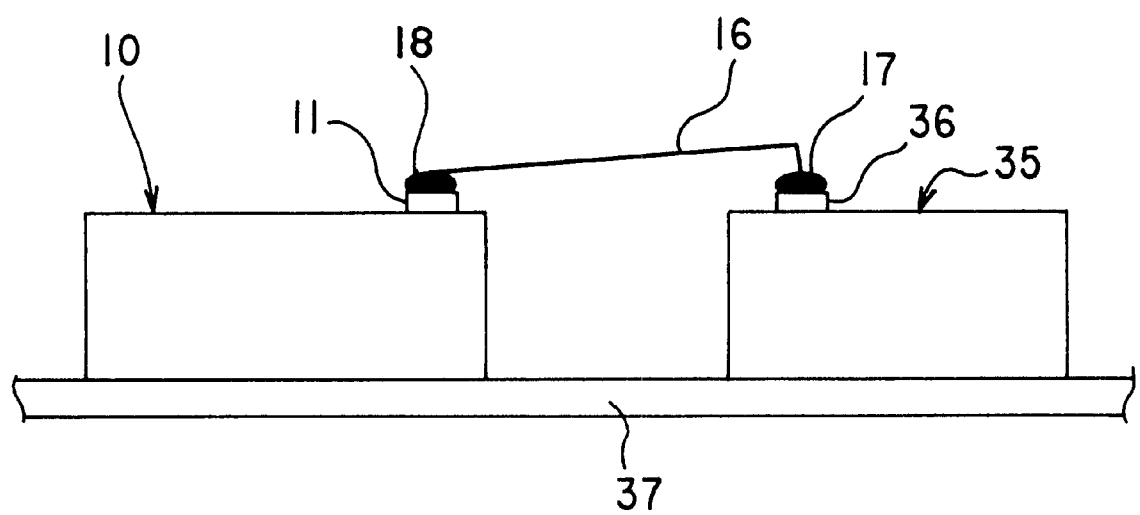
FIG. 18 shows an example in which the wire bonding method of the present invention is applied to the multi-chip module.

FIG. 18 shows an example where the wire bonding method of the present invention is applied to a multi-chip module (MCM). In the multi-chip module shown, a plurality of semiconductor elements including semiconductor elements 10 and 35 are provided on a substrate 37.

As shown in FIG. 18, the wire bonding method of the present invention can be applied not only to connecting the semiconductor element 10 to the inner lead 13 but to connecting the semiconductor element 10 to the semiconductor element 35 directly in a multi-chip module configuration. Other conceivable applications of the wire bonding method of the present invention include connecting a plurality of leads to each other using a wire. Thus, the wire bonding method of the present invention can be applied to various configurations in which a wire is used to connect members.

Figure 1:
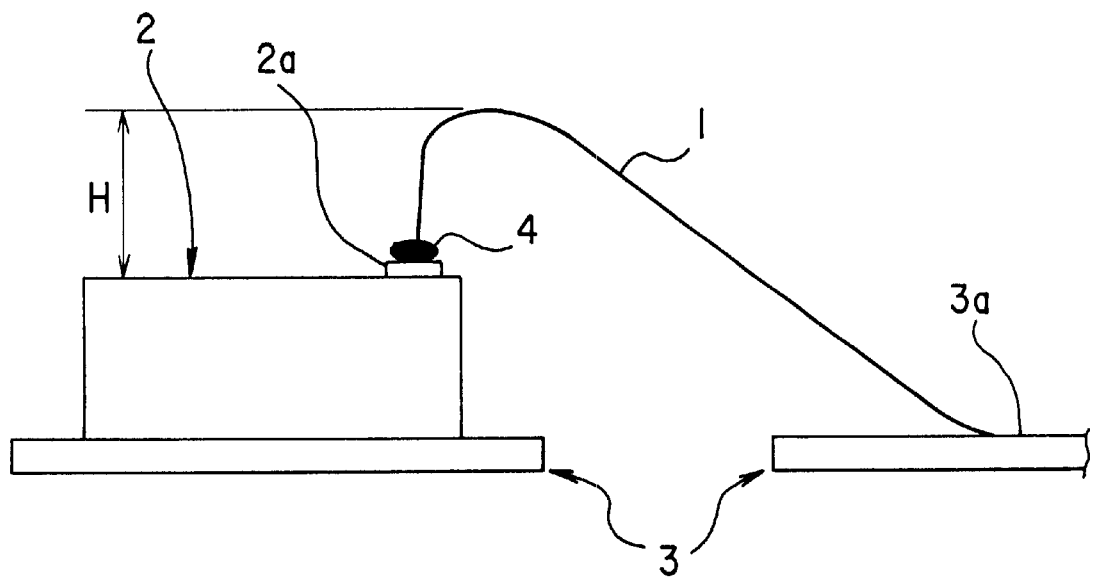
FIG. 1 shows a conventional forward bonding.
Figure 2:
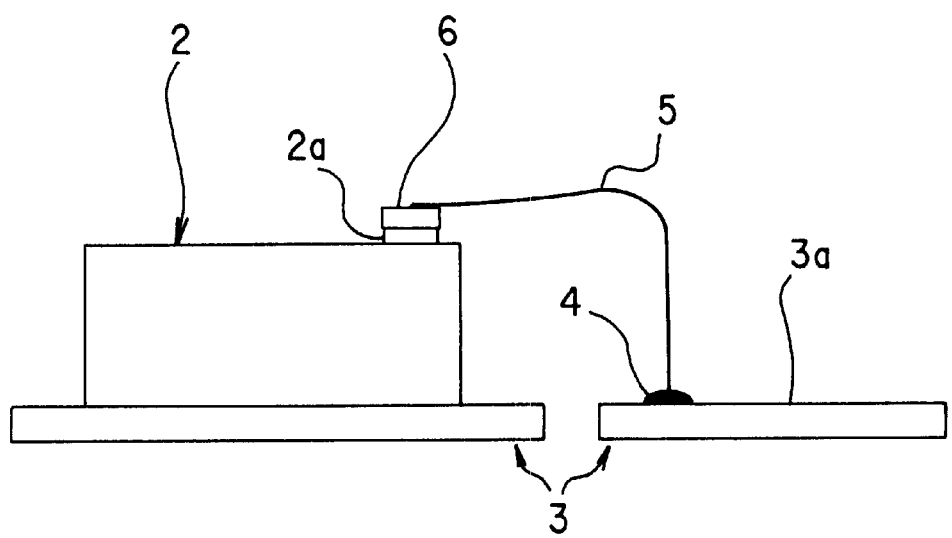
FIG. 2 shows a conventional backward bonding.
Figure 3A:
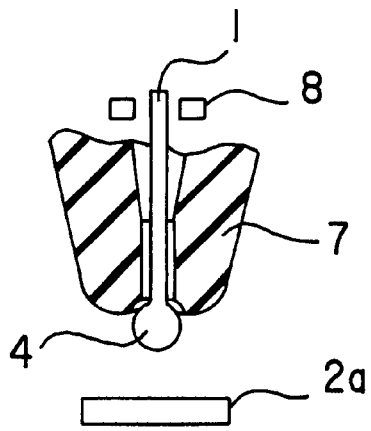
FIGS. 3A–3C explain ball bonding.
Figure 3B:
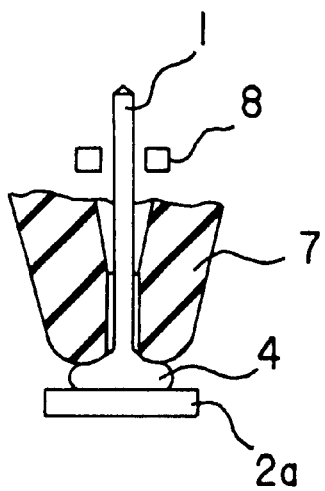
Figure 3C:
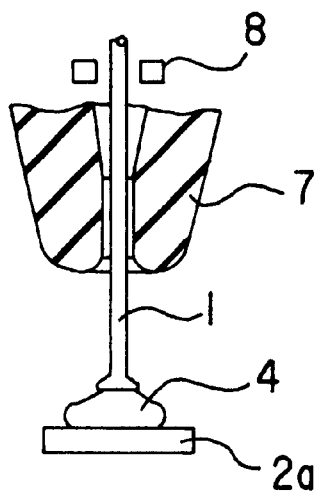
Figure 4A:
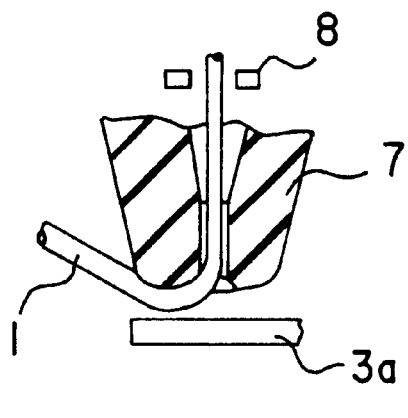
FIGS. 4A–4C explain stitch bonding.
Figure 4B:
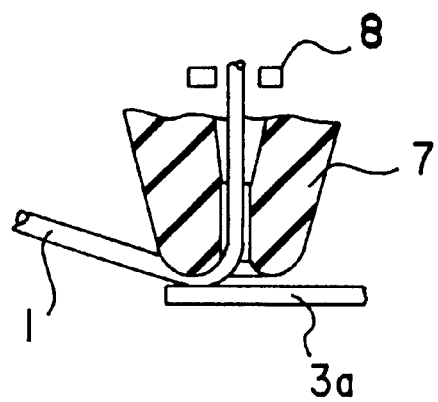
Figure 4C:
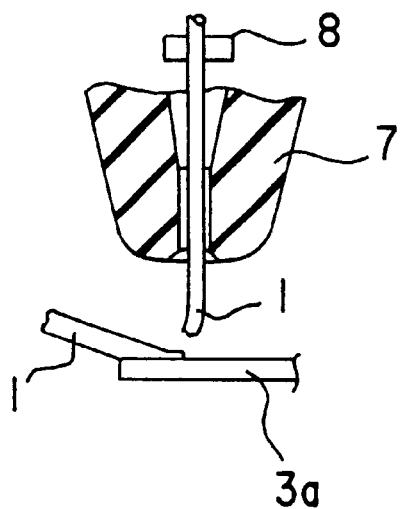
Figure 7:
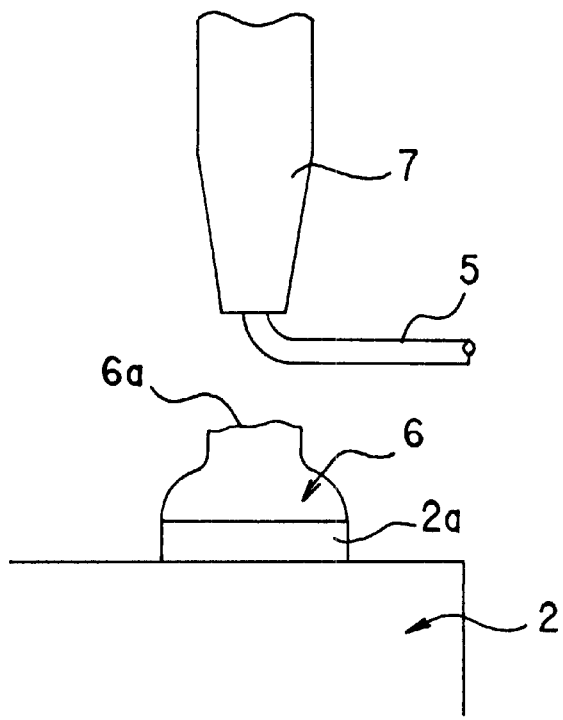
FIG. 7 illustrates a problem with the conventional backward bonding.
Figure 8:
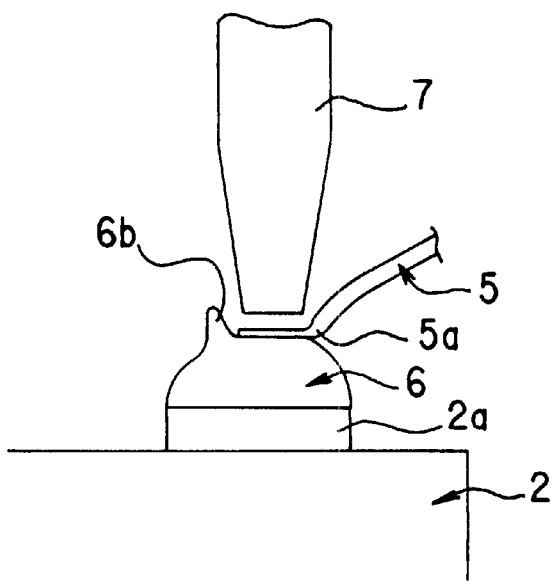
FIG. 8 illustrates a problem with the conventional backward bonding.

The backward bonding process described with reference to FIG. 2 is useful to keep the height of the loop formed by the wire 5 low, if the pads 2a to which the wire is stitch-bonded are not placed with a high density. However, as shown in FIGS. 7 and 8, the conventional method of forming the ball bump 6 has a disadvantage in that the upper major surface 6a of the ball bump 6 is rugged, or the bump 6b is produced thereon. This disadvantage hinders the backward bonding process from being practiced. If the upper major surface 6a can be finished flat when the ball bump 6 is formed, the backward bonding process can be advantageously employed.

A description will now be given, with reference to FIGS. 19A–24, of a method of forming a ball bump in which the upper major surface 6a of the ball bump 6 can be made flat. In FIGS. 19A–24, those components that are the same as the components shown in FIGS. 9–14 are designated by the same reference numerals and the description thereof is omitted.

FIGS. 14A and 14B show a capillary 40 used in the method of forming a ball bump according to a third embodiment of the present invention. FIG. 11A is a front view of the entirety of the capillary 40, and FIG. 14B is an enlarged lateral sectional view of a lower end of the capillary 40.

The feature of the capillary 40 is that a projection is provided at the lower end of a capillary main body 41 having a cylindrical shape. Specifically, a bonding part 42 is formed to project from a center of the end of the capillary main body 41. A flat surface that lies adjacent to the bonding part 42 constitutes a pressurizing part 43. An insertion hole 44 through which the wire 16 is inserted is formed at the center of the capillary 40.

The bonding part 42 is used to bond a ball-shaped part 50 to the pad 11 as described below. The pressurizing part 43 is used to shape a ball bump 51 formed in the pad 11 as described below.

Figure 19B:
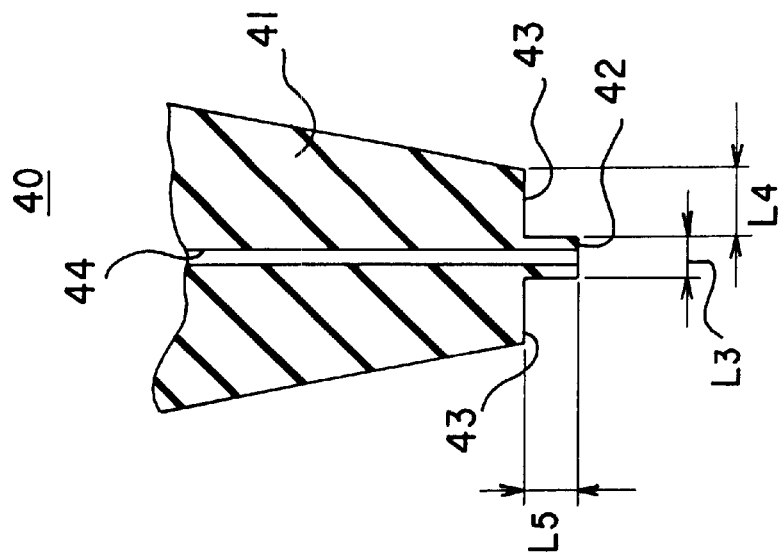
FIG. 19B is a lateral sectional view showing a portion near an end of the capillary on an enlarged scale.
Figure 19A:
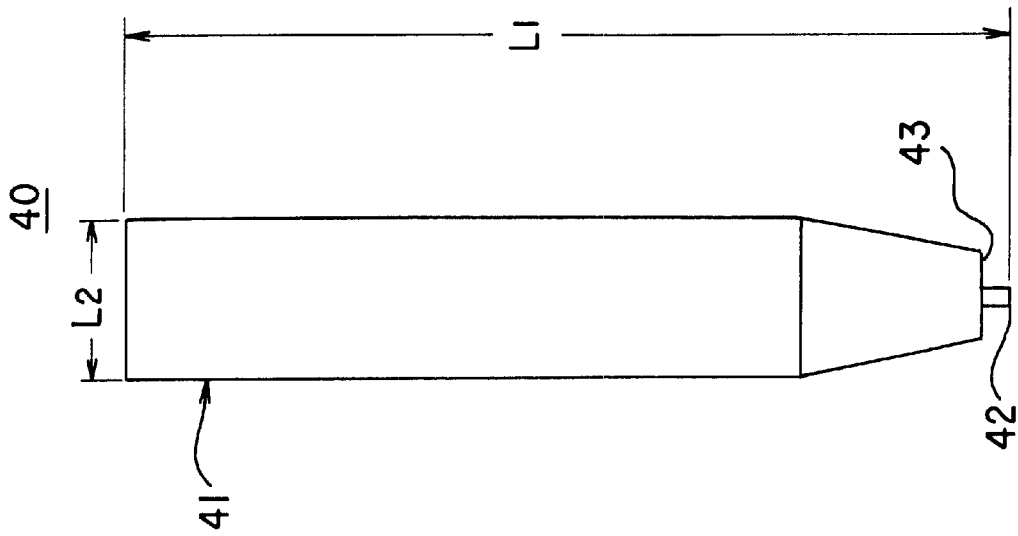
FIG. 19A is a front view of a capillary according to the present invention.
Figure 20:
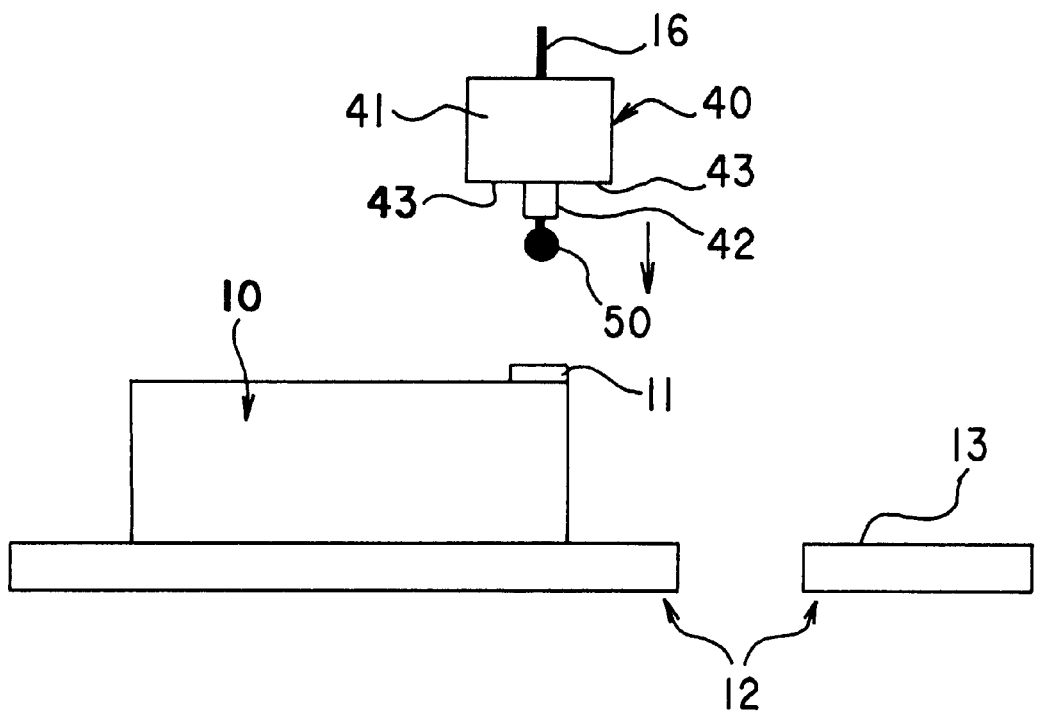
FIG. 20 shows a method for forming a ball bump, specifically showing a gold ball being formed.

Referring to FIGS. 19A and 19B, the dimensions of the capillary 40 is such that, for example, L1=9.525 [mm], L2=1.588 [mm], L3=0.15–0.25 [mm], L4=0.2–0.4 [mm], and L5=0.2–0.3 [mm]. The shape of the capillary 40 is not limited to the one shown in FIGS. 19A and 19B.

The capillary 40 having the above-described construction is a simple variation of the conventional capillary 7 (see FIGS. 3A–4C) in that only the end of the capillary is modified. The bonding part 42 and the pressurizing part 43 can be easily formed by machining the capillary 40 (for example, by a cutting process). Therefore, providing the bonding part 42 and the pressurizing part 43 does not invite a rise in the cost for producing the capillary 40.

A description will now be given, with reference to FIGS. 20–24, of the method of forming the ball bump using the capillary 40. Although the illustrated shape of the capillary 40 shown in FIGS. 20–24 is different from that of FIGS. 19A and 19B, the illustrations designate the same entity throughout.

When the wire 16 is inserted through the capillary 40, the ball bump 51 is formed on the pad 11 such that the ball-shaped part 50 is formed in that part of the wire 16 that projects downward from the end of the bonding part 42. Specifically, the ball-shaped part 50 is formed by spark discharge using the spark electrode (not shown in FIG. 20) in a process similar to the one shown in FIG. 9.

Figure 21:
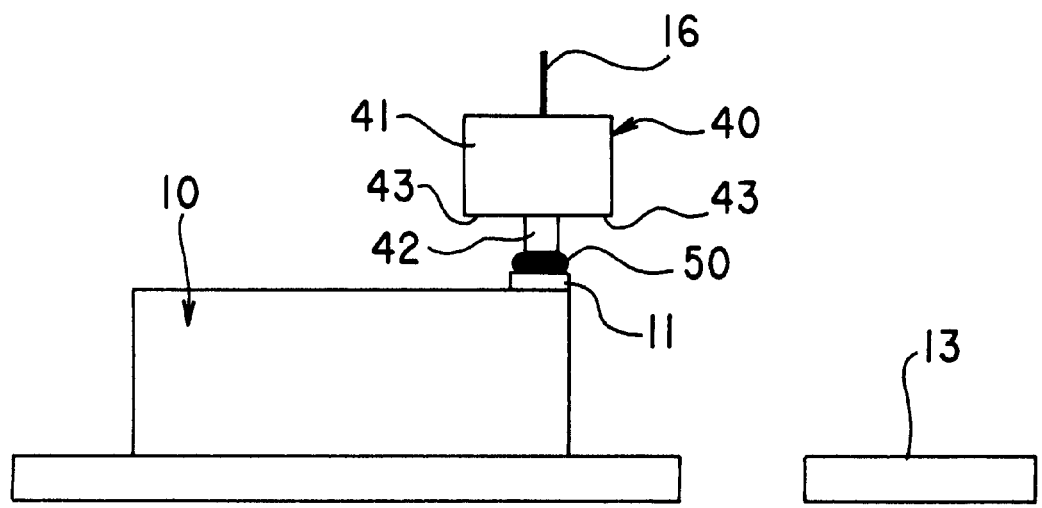
FIG. 21 shows a state in which the gold ball is bonded to a pad.

When the ball-shaped part 50 is formed at the end of the wire 16 that projects from the bonding part 42, the capillary 40 is lowered by a translating unit to approach the pad 11. As shown in FIG. 21, the bonding part 42 formed in the capillary 40 presses the ball-shaped part 50 against the pad 11.

Subsequently, ultrasonic oscillation is generated by an ultrasonic oscillator so that the bonding part 42 formed in the capillary 40 acts to weld the ball-shaped part 50 on the pad 11 (connected member as described in the claims). As a result, the ball-shaped part 50 is ball-bonded to the pad 11. This part of the wire bonding process will be referred to as a bonding process.

Figure 22:
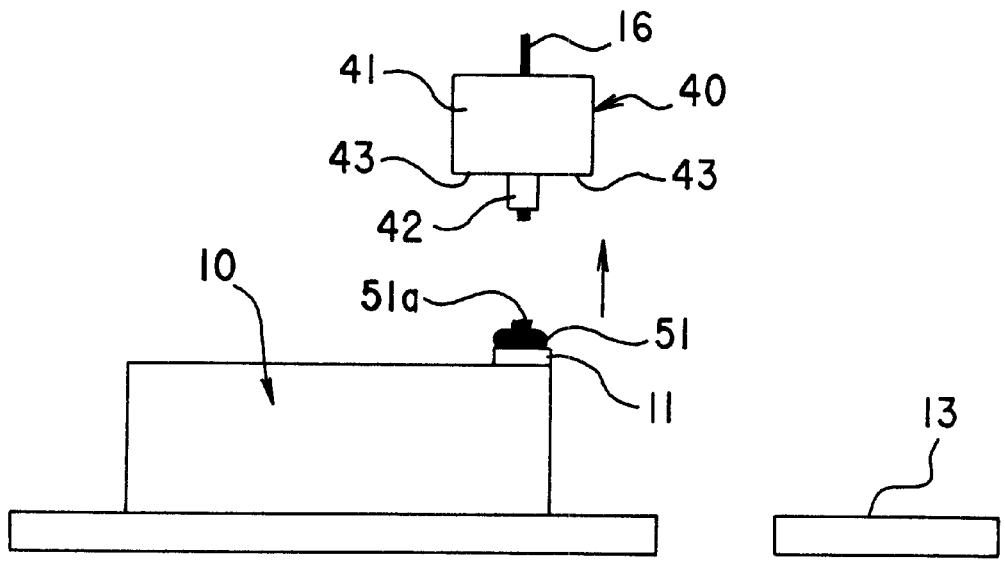
FIG. 22 shows a state in which the ball bump is formed.

When ball-shaped part 50 is bonded to the pad 11, the capillary 40 is raised. Since a clamper (not shown) prohibits the wire 16 from being fed, the wire 16 is cut at a position above the ball-shaped part 50. As shown in FIG. 22, the ball bump 51 is formed. This part of the wire bonding process will be referred to as a ball bump forming process.

Immediately after the ball bump forming process, an upper major surface 51a of the ball bump 51 is rugged and bumpy. Therefore, as has already been described, the backward bonding process cannot be carried out properly using the ball bump 51 at this stage.

According to the third embodiment, the ball bump 51 is shaped after the ball bump forming process.

Figure 23:
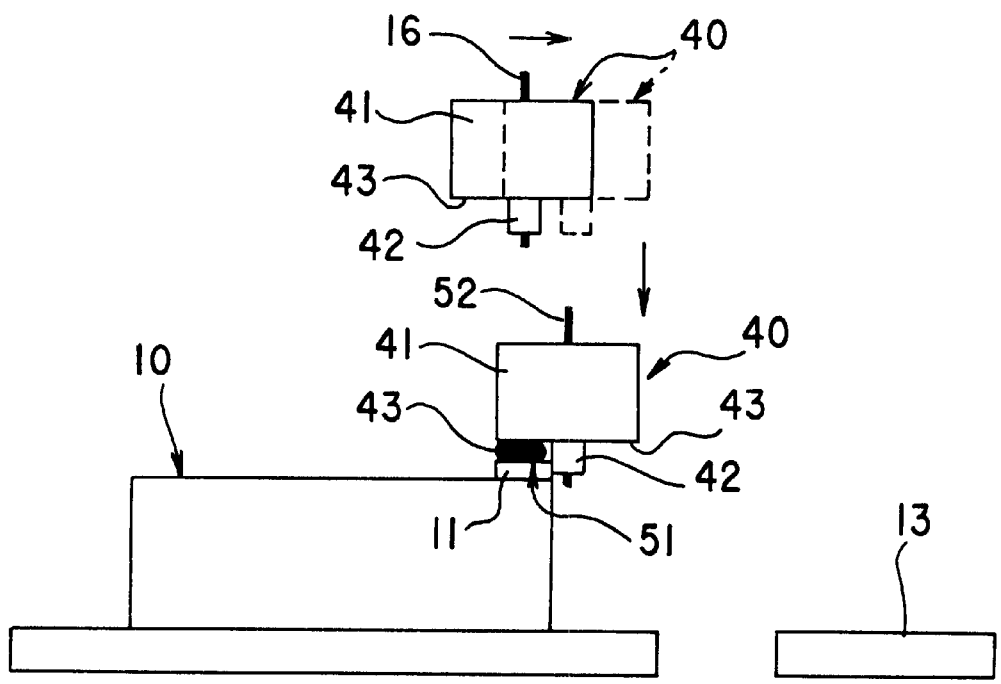
FIG. 23 shows a process for shaping the ball bump.

In the shaping process, the capillary 40 is translated horizontally as shown in FIG. 23 to a position at which the pressurizing part 43 formed in the capillary 40 is directly opposite the ball bump 51.

The capillary 40 is used to provide the wire 16 between the pad 11 and the inner lead 13. For this reason, the capillary 40 is configured to be movable both vertically and horizontally. Therefore, the above-described process of translating the capillary 40 does not require any additional construction of the wire bonding unit.

While the pressurizing part 43 is directly opposite the ball bump 51, the capillary 40 is lowered. As shown in FIG. 23, the pressurizing part 43 presses the ball bump 51.

Figure 24:
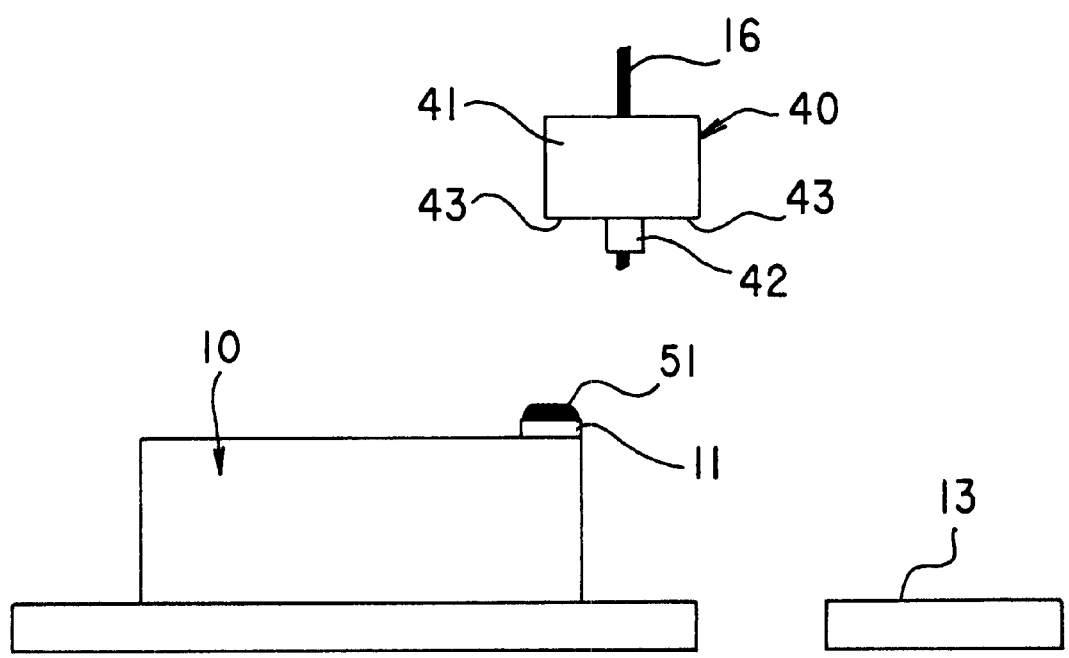
FIG. 24 shows a shaped ball bump.

Since the pressurizing part 43 has a flat surface, the rugged and bumpy upper major surface 51a of the ball bump 51 is turned into a flat surface by the pressure provided by the pressurizing part 43, when the ball bump forming process is completed. Subsequent to this process, the capillary 40 is raised again so that the pressurizing part 43 is separated from the ball bump 51. As a result of this, the ball bump 51 having its upper surface 51a turned flat is formed, as shown in FIG. 24. This part of the wire bonding process is referred to as a shaping process.

As has been described, according to the ball bump forming process of the third embodiment, the upper surface 51a of the ball bump 51 can be turned flat by pressing and shaping the upper surface 51a of the ball bump 51 using the pressurizing part 43 of the capillary 40. It is to be appreciated that, in the subsequent backward bonding process, the ball bump 51 and the wire 16 can be bonded more properly and securely than with the conventional technology.

By using the capillary 40 as shown in FIGS. 19A and 19B having the bonding part 42 and the pressurizing part 43 formed at its end, the bonding process, the ball bump forming process and the shaping process can be performed consecutively. Accordingly, the process of forming the ball bump 51 can be effected efficiently.

A description will now be given, with reference to FIGS. 25–29, of a method of performing the backward bonding between the ball bump 51 formed on the pad 11 and the inner lead 13. In FIGS. 25–29, those components that are the same as the components of FIGS. 9–14 are designated by the same reference numerals and the description thereof is omitted.

Figure 25:
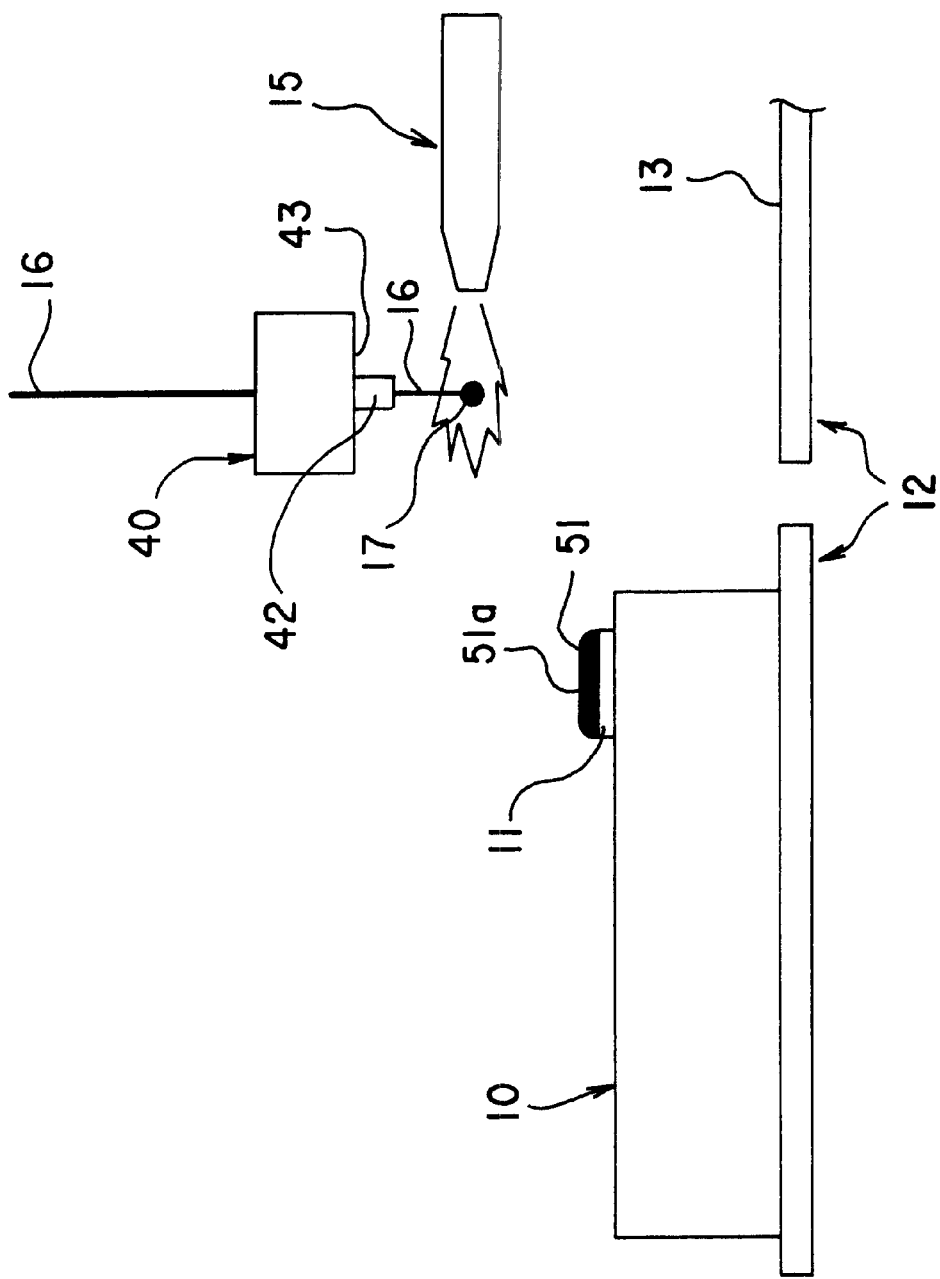
FIG. 25 shows a wire bonding process for bonding a wire to the ball bump, specifically explaining a method for forming a ball-shaped part in the wire.

In order to connect the ball bump 51 (pad 11) and the inner lead 13 using the wire 16, the ball-shaped part 17 is formed in the part of the wire 16 which projects from the bonding part 42 of the capillary 40, as shown in FIG. 25. The ball-shaped part 17 is formed by inducing spark discharge in the spark electrode 15.

Figure 26:
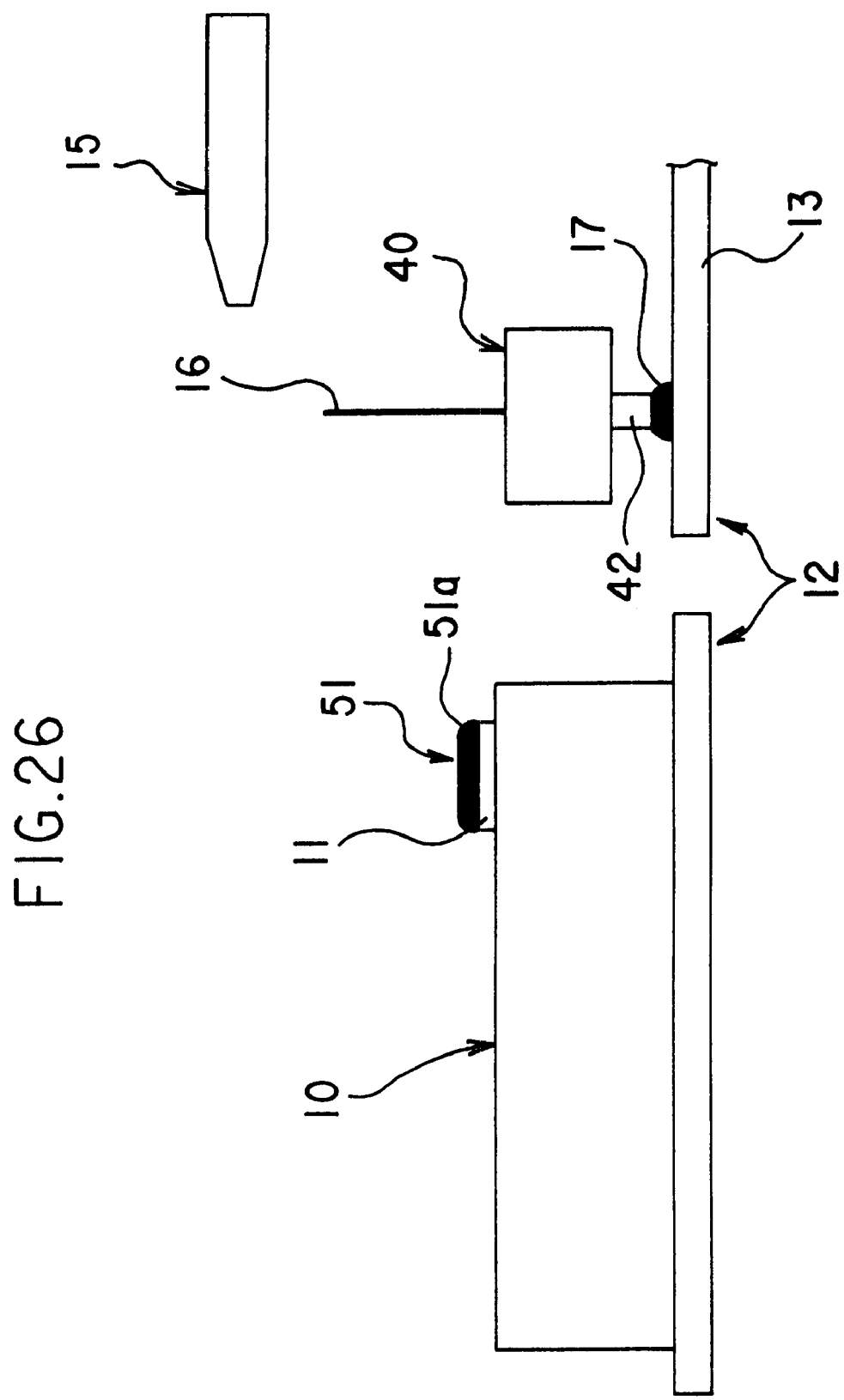
FIG. 26 explains a method for bonding the ball-shaped part to a lead frame.
Figure 27:
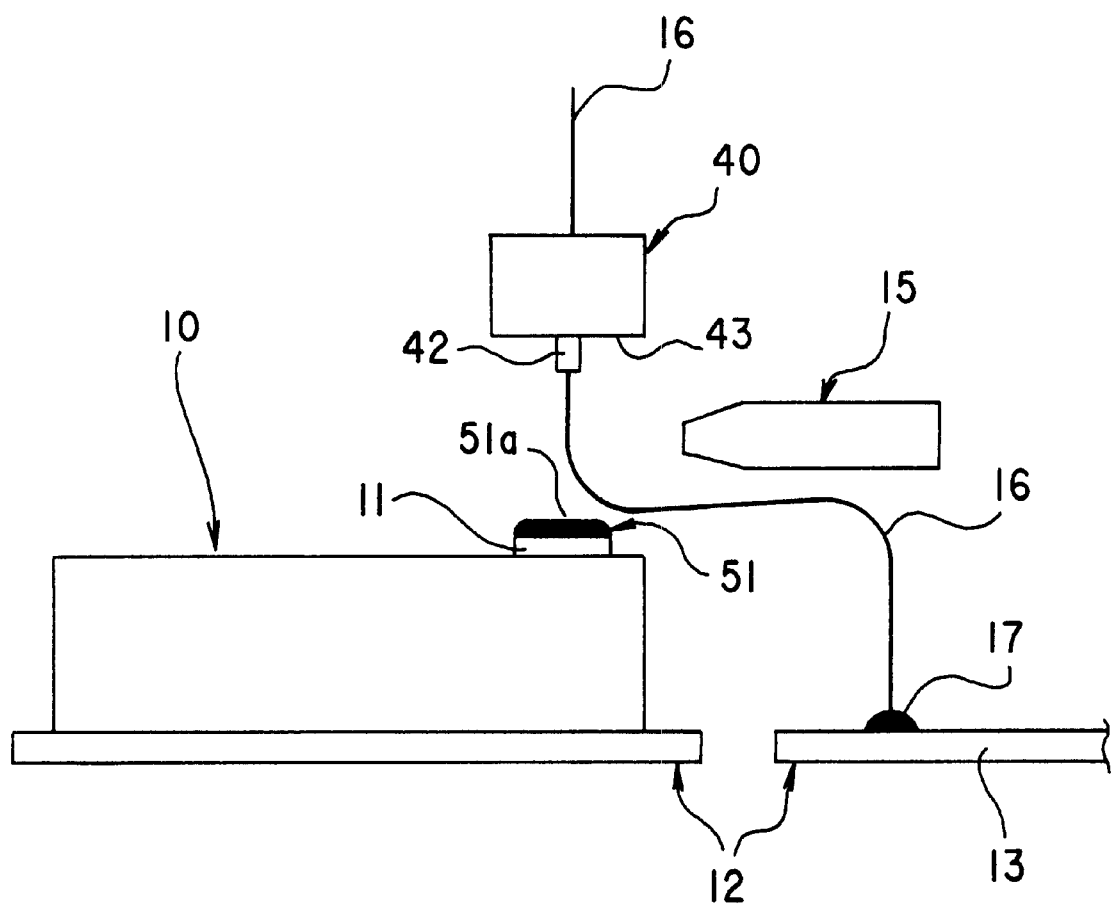
FIG. 27 shows a state in which the wire is guided toward the ball bump.

When the ball-shaped part 15 is formed at the end of the wire 16, the capillary 40 is translated by the translation unit to approach the inner lead 13. As shown in FIG. 26, the capillary 40 presses the ball-shaped part 17 against the inner lead 13. Subsequently, an ultrasonic oscillator generates ultrasonic oscillation so that the bonding part 42 causes the ball-shaped part 17 welded on the inner lead 13 (first bonding using the ball bonding process).

When the wire 16 (ball-shaped part 17) is bonded to the inner lead 13, the capillary 40 is translated vertically upward to a level which is slightly higher than the upper major surface of the semiconductor element 10, and then translated horizontally so that the capillary 40 is above the ball bump 51. As a result of this translation, the wire 16 forms a L-shaped loop including a vertical portion which projects vertically upward from the inner lead and a horizontal portion which extends horizontally, as shown is FIG. 27.

Figure 28:
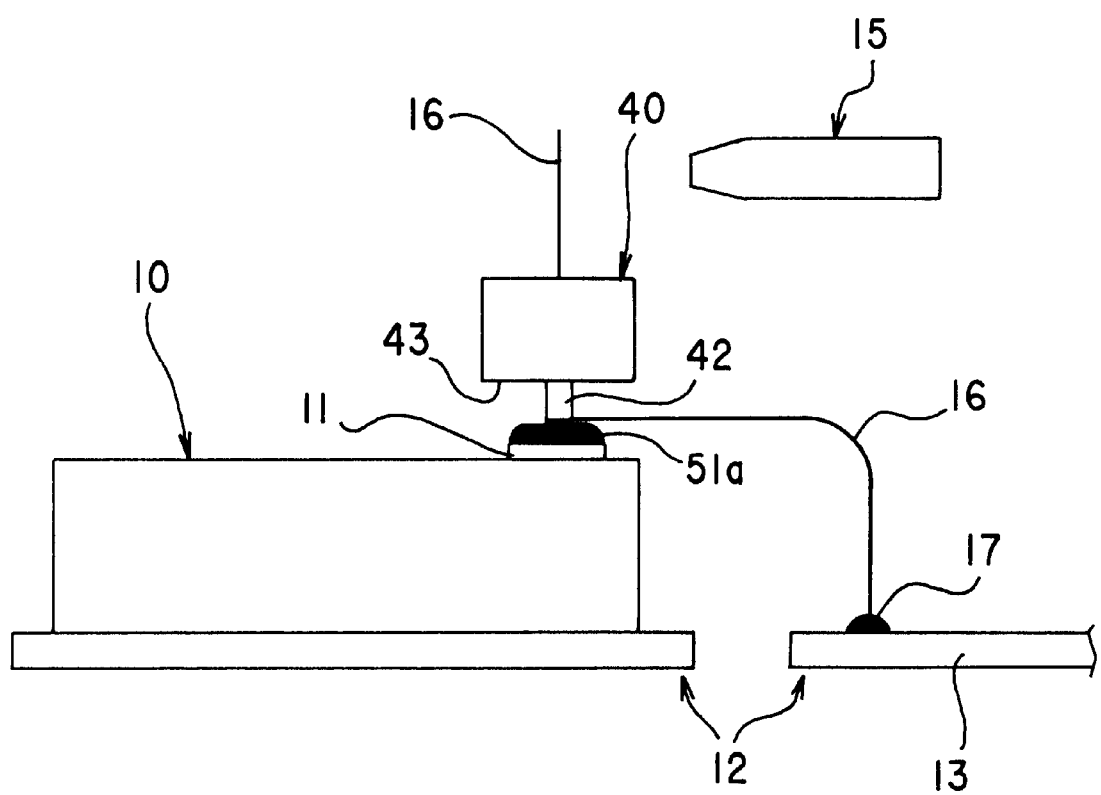
FIG. 28 shows a state in which the wire is being bonded to the ball bump.

When the wire 16 is guided by drawing to a position above the ball bump 51, the capillary 40 is lowered so that the bonding part 42 causes the wire 16 to be pressed against the ball bump 51, and the ultrasonic oscillator generates ultrasonic oscillation. Thus, as shown in FIG. 28, the bonding part 42 causes the wire 16 to be bonded to the ball bump 51 in a ultrasonic welding process (second bonding using the stitch bonding process).

Since the upper major surface 51a of the ball bump 51 is flat, it is ensured that the wire 16 is properly and securely bonded to the ball bump 51. The wire bonding process according to the above-described configuration offers an improved degree of reliability as compared to the conventional technology.

Figure 29:
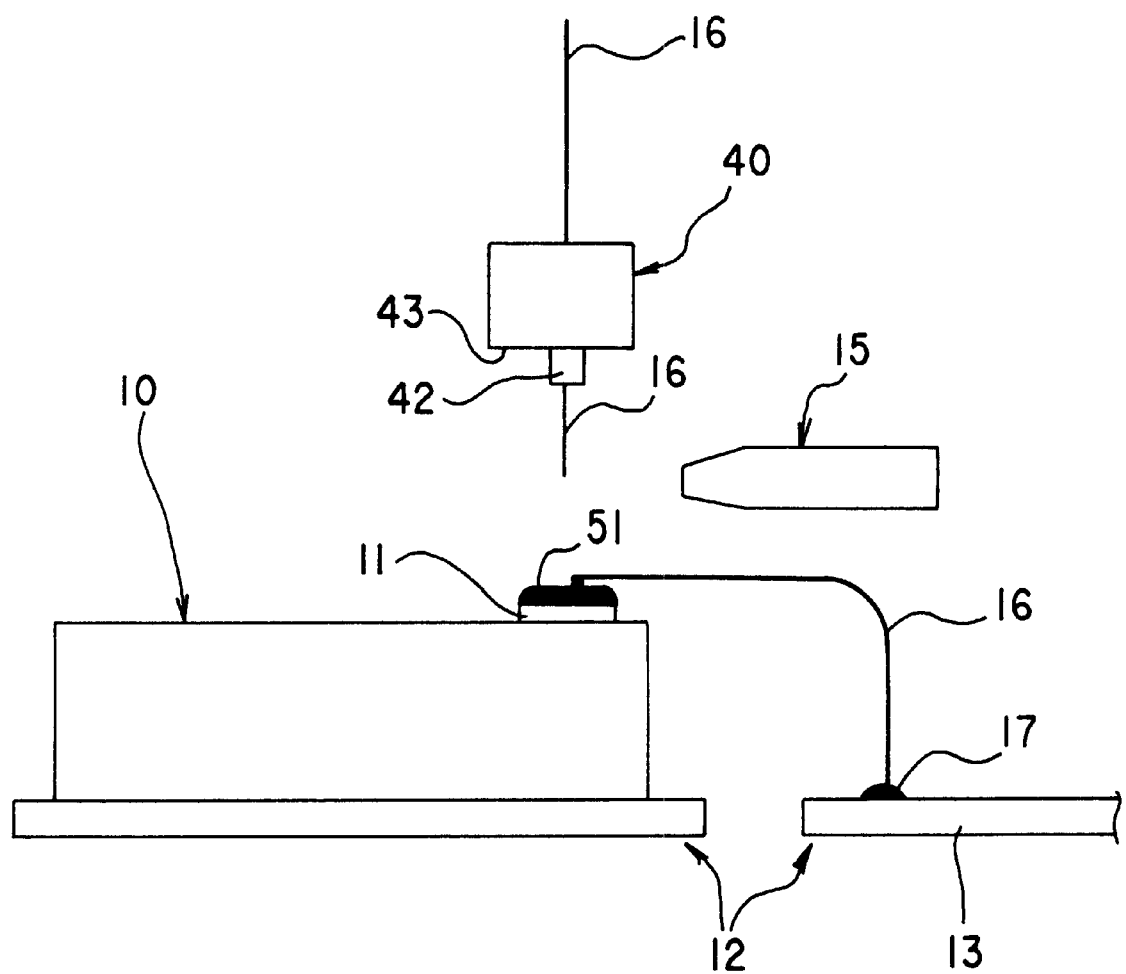
FIG. 29 shows a state in which the wire has been bonded to the ball bump.

When the wire 16 is bonded to the ball bump 51 (pad 11), the capillary 40 is raised, resulting in a state shown in FIG. 29. A clamper (not shown) prevents the wire 16 from being fed while the capillary is being raised so that the wire 16 is cut at the bonding position during the upward translation of the capillary 40. This completes one sequence of the backward bonding process for the wire 16.

Thereafter, the ball-shaped part 17 is formed again as shown in FIG. 25. Then, the above-described processes shown in FIGS. 25–29 are repeated. In this way, the wire bonding process for providing the wire 16 between each pair of the ball bump 51 and the inner lead 13 is carried out on a continuous basis.

It will be appreciated that, in the above-described process, the capillary 40 used in the ball bump forming process is also used in the backward bonding process so that it is possible to form the ball bump 51 and the wire 16 in a successive manner, resulting in an improvement in the efficiency with which the entire wire bonding process is carried out. Since the wire bonding unit is used both for the purpose of forming ball bumps and effecting the backward bonding, the entire wire bonding system can have a simple configuration.

The present invention is not limited to the above described embodiments, and variations and modifications may be made without departing from the scope of the present invention.

What is claimed is:

1. A semiconductor device comprising:

a semiconductor element having a surface;

a lead;

a wire connecting said semiconductor element and said lead, wherein said lead is directly bonded to said wire using a first ball-shaped part formed in said wire, an electrode formed in said semiconductor element is directly bonded to said wire using a second ball-shaped part formed in said wire, said second ball-shaped part forming a ball-shaped bond on said electrode, and said wire forms a loop having a curved bend portion and including a vertical straight portion that extends perpendicular to said lead, and a horizontal straight portion that extends parallel to the surface of said semiconductor element onto which said wire is bonded.

2. The semiconductor device as claimed in claim 1 further comprising:

another lead; and another wire connecting said semiconductor element and said another lead, wherein a height of another loop formed by said another wire is greater than a height of said loop formed by said wire, wherein said height of each of said loops is defined as a vertical distance between said first ball-shaped part and an apex of each of said loops.

3. The semiconductor device as claimed in claim 2, further comprising another electrode formed in said semiconductor element, said another electrode being directly bonded to said another wire using a third ball-shaped part formed in said another wire.

4. The semiconductor device as claimed in claim 2, further comprising a die bonding layer, provided in a substrate, onto which said semiconductor element is mounted.

* * * * *

UNITED STATES PATENT AND TRADEMARK OFFICE
CERTIFICATE OF CORRECTION

PATENT NO.    : 6,495,773 B1
DATED         : December 17, 2002
INVENTOR(S)   : Nomoto et al.

It is certified that error appears in the above-identified patent and that said Letters Patent is hereby corrected as shown below:

Title page,
Item [30] Foreign Application Priority Data, should read
-- [30]   Foreign Application Priority Data
Apr. 10, 1995   (JP) ...................................7-083726 --

Signed and Sealed this

Twelfth Day of August, 2003

JAMES E. ROGAN
*Director of the United States Patent and Trademark Office*